United States Patent
Tachibana et al.

(10) Patent No.: US 7,601,479 B2
(45) Date of Patent: *Oct. 13, 2009

(54) POLYMER, RESIST COMPOSITION AND PATTERNING PROCESS

(75) Inventors: Seiichiro Tachibana, Niigata-ken (JP); Tsunehiro Nishi, Niigata-ken (JP); Tomohiro Kobayashi, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/936,753

(22) Filed: Sep. 9, 2004

(65) Prior Publication Data
US 2005/0058938 A1    Mar. 17, 2005

(30) Foreign Application Priority Data
Sep. 12, 2003    (JP)    ............................ 2003-320659

(51) Int. Cl.
- *G03F 7/039* (2006.01)
- *G03F 7/20* (2006.01)
- *G03F 7/30* (2006.01)
- *G03F 7/38* (2006.01)
- *C08F 224/00* (2006.01)

(52) U.S. Cl. ................. 430/270.1; 430/910; 430/326; 430/330; 526/268; 526/270

(58) Field of Classification Search .......... 430/270.1, 430/910, 326, 330; 526/281, 282, 270, 268
See application file for complete search history.

(56) References Cited

U.S. PATENT DOCUMENTS

| | | | |
|---|---|---|---|
| 6,004,724 A | 12/1999 | Yamato et al. | |
| 6,261,738 B1 | 7/2001 | Asakura et al. | |
| 6,280,898 B1 | 8/2001 | Hasegawa et al. | |
| 6,284,429 B1* | 9/2001 | Kinsho et al. | 430/270.1 |
| 6,312,867 B1 | 11/2001 | Kinsho et al. | |
| 6,479,211 B1* | 11/2002 | Sato et al. | 430/270.1 |
| 6,517,994 B2 | 2/2003 | Watanabe | |
| 6,610,456 B2* | 8/2003 | Allen et al. | 430/270.1 |
| 7,105,275 B2 | 9/2006 | Sato | |
| 2003/0054290 A1* | 3/2003 | Nishi et al. | 430/270.1 |
| 2003/0224288 A1* | 12/2003 | Kodama | 430/270.1 |
| 2004/0259028 A1* | 12/2004 | Sato | 430/270.1 |
| 2005/0031989 A1* | 2/2005 | Watanabe et al. | 430/270.1 |

FOREIGN PATENT DOCUMENTS

| | | |
|---|---|---|
| JP | 4-39665 A | 2/1992 |
| JP | 9-95479 A | 4/1997 |
| JP | 9-208554 A | 8/1997 |
| JP | 9-230588 A | 9/1997 |
| JP | 9-301948 A | 11/1997 |
| JP | 2906999 A | 4/1999 |
| JP | 2000-159758 A | 6/2000 |
| JP | 2000-314956 A | 11/2000 |
| JP | 2000-336121 A | 12/2000 |
| JP | 2002-285161 A | 10/2002 |
| JP | 2003-2883 A | 1/2003 |
| JP | 2003-5374 A | 1/2003 |
| JP | 2004-115486 A | 4/2004 |
| JP | 2005-31624 A | 2/2005 |

\* cited by examiner

*Primary Examiner*—Sin J. Lee
(74) *Attorney, Agent, or Firm*—Birch, Stewart, Kolasch & Birch, LLP

(57) ABSTRACT

A polymer comprising recurring units of formulae (1) to (4) wherein $R^1$, $R^3$, $R^4$ and $R^7$ are hydrogen or methyl, $R^2$ is an acid labile group, $R^5$ and $R^6$ are hydrogen or hydroxyl, and $R^8$ is a lactone structure group and having a Mw of 1,000–50,000 is provided. A resist composition comprising the inventive polymer has a sensitivity to high-energy radiation, improved resolution and etching resistance and lends itself to lithographic micropatterning with electron beams or deep UV.

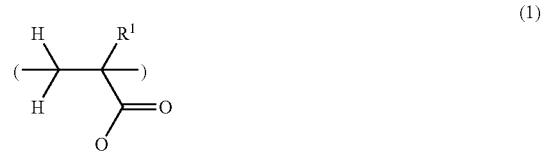

(1)

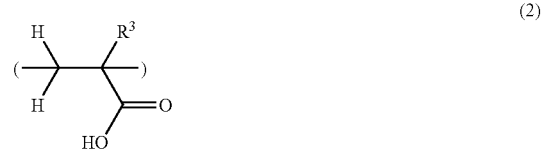

(2)

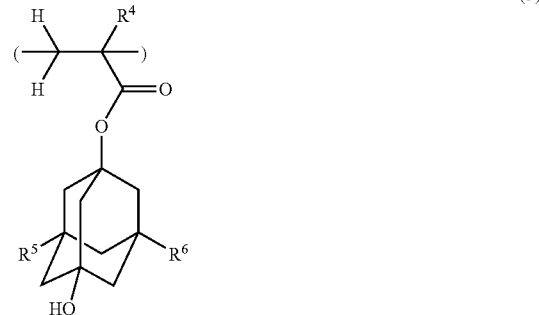

(3)

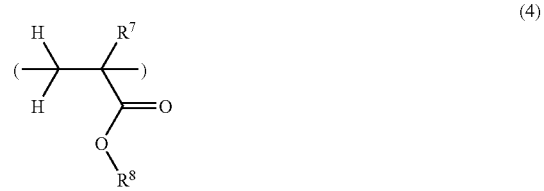

(4)

9 Claims, No Drawings

POLYMER, RESIST COMPOSITION AND PATTERNING PROCESS

CROSS-REFERENCE TO RELATED APPLICATIONS

This non-provisional application claims priority under 35 U.S.C. Section 119(a) on Patent Application No. 2003-320659 filed in Japan on Sep. 12, 2003, the entire contents of which are incorporated herein by reference.

TECHNICAL FIELD

This invention relates to (i) a novel polymer for resist use, (ii) a resist composition comprising the polymer as a base resin for use in the micropatterning technology, and (iii) a patterning process using the resist composition.

BACKGROUND OF THE INVENTION

While a number of recent efforts are being made to achieve a finer pattern rule in the drive for higher integration and operating speeds in LSI devices, deep-ultraviolet lithography is thought to hold particular promise as the next generation in microfabrication technology. In particular, photolithography using a KrF or ArF excimer laser as the light source is strongly desired to reach the practical level as the micropatterning technique capable of achieving a feature size of 0.3 µm or less.

The chemically amplified resist materials for use in photolithography using light of an excimer laser, especially ArF excimer laser having a wavelength of 193 nm, are, of course, required to have a high transparency to light of that wavelength. In addition, they are required to have an etching resistance sufficient to allow for film thickness reduction, a high sensitivity sufficient to eliminate any extra burden on the expensive optical material, and especially, a high resolution sufficient to form a precise micropattern. To meet these requirements, it is crucial to develop a base resin having a high transparency, rigidity and reactivity. Active efforts have been made to develop such base resins.

Known high transparency resins include copolymers of acrylic or methacrylic acid derivatives (see JP-A 4-039665). Since these copolymers allow the amount of acid labile units to be increased as desired, it is relatively easy to enhance the acid reactivity of high molecular weight copolymers.

Introduction of more acid labile units is advantageous in achieving a higher sensitivity and contrast, but gives rise to the problem of exaggerated pattern density-dependent size difference. Namely, even when an identical quantity of exposure is made through a mask with an identical feature size, the feature size of the resulting pattern becomes significantly smaller in densely packed line areas than in sparsely packed line areas. This suggests a contradiction that a larger amount of acid labile units sufficient to provide a higher sensitivity and resolution is unacceptable for practical use because of exaggerated pattern density-dependent size difference whereas a smaller amount of acid labile units provides an acceptable level of pattern density-dependent size difference, but impractical levels of sensitivity and resolution.

SUMMARY OF THE INVENTION

An object of the invention is to provide a novel polymer for use in the formulation of a resist composition which has good etching resistance and adhesion and satisfies both a high resolution and a minimized pattern density-dependent size difference when processed by photolithography using light with a wavelength of up to 300 nm, especially ArF excimer laser light as the light source. Another object of the invention is to provide a resist composition comprising the polymer as a base resin, and a patterning process.

The inventor has found that a resist composition comprising as a base resin a polymer comprising recurring units of the general formulae (1), (2), (3) and (4), shown below, has good etching resistance, pattern rectangularity and adhesion and satisfies both a high resolution and a minimized line density-dependent size difference. The recurring units of formula (3) contribute to good etching resistance, the recurring units of formula (4) contribute to good adhesion and developer affinity, and the recurring units of formula (2) contribute to both a high resolution and a minimized line density-dependent size difference.

In a first aspect, the present invention provides a polymer comprising recurring units of the general formulae (1) to (4) and having a weight average molecular weight of 1,000 to 50,000.

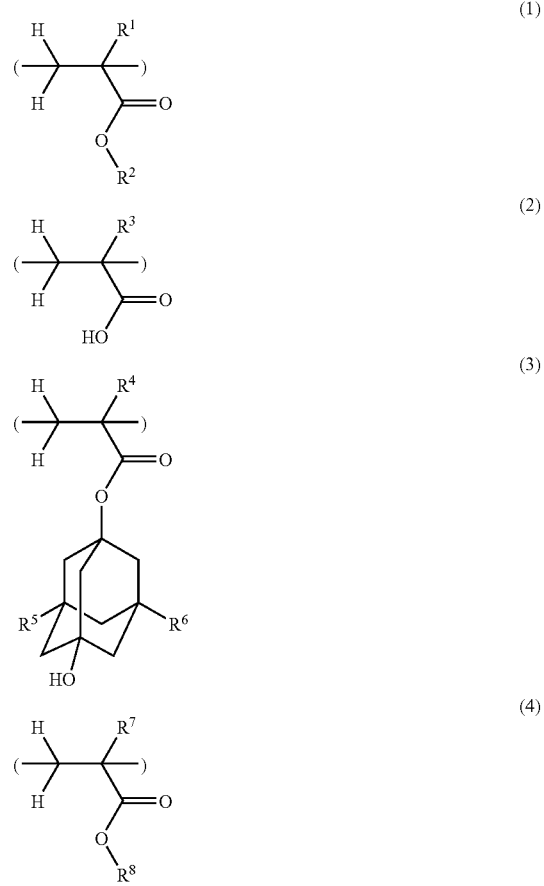

Herein $R^1$, $R^3$, $R^4$ and $R^7$ are each independently hydrogen or methyl, $R^2$ is an acid labile group, $R^5$ and $R^6$ are each independently hydrogen or hydroxyl, and $R^8$ is a group having a lactone structure.

In a preferred embodiment, $R^2$ in the recurring units of formula (1) is at least one group selected from groups of the general formulae ($R^2$-1) and ($R^2$-2).

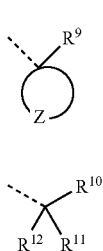 (R²-1)

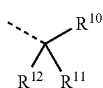 (R²-2)

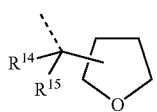 (R²-7)

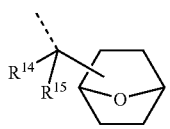 (R²-8)

Herein a broken line depicts a bond position, $R^9$, $R^{10}$, $R^{11}$ and $R^{12}$ are each independently a straight, branched or cyclic $C_1$-$C_{12}$ group which may contain an oxygen atom, Z is an atom group which forms a cyclic structure or a derivative thereof with the carbon atom to which it is bonded, the cyclic structure being selected from the group consisting of cyclopentane, cyclohexane, norbornane, adamantane, tricyclo[5.2.1.0²,⁶]decane and tetracyclo[4.4.0.1²,⁵.1⁷,¹⁰]dodecane.

In a preferred embodiment, $R^2$ in the recurring units of formula (1) is at least one group selected from tertiary exo-alkyl groups having a bicyclo[2.2.1]heptane structure represented by the general formulae (R²-3) to (R²-6).

Herein a broken line depicts a bond position, and $R^{14}$ and $R^{15}$ are each independently a straight, branched or cyclic $C_1$-$C_{10}$ alkyl group, or $R^{14}$ and $R^{15}$, taken together, may form a ring with the carbon atom to which they are bonded.

In a preferred embodiment, $R^2$ in the recurring units of formula (1) is at least one group selected from groups represented by the general formulae (R²-3) to (R²-6) and at least one group selected from groups represented by the general formulae (R²-7) and (R²-8).

In a preferred embodiment, $R^8$ in the-recurring units of formula (4) is at least one group selected from groups represented by the general formulae (R⁸-1) to (R⁸-10).

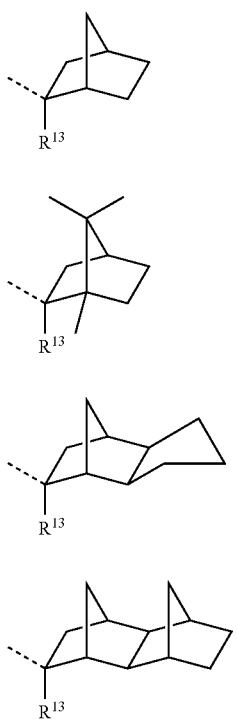

(R²-3)

(R²-4)

(R²-5)

(R²-6)

Herein a broken line depicts a bond position and bond direction, and $R^{13}$ is each independently a straight, branched or cyclic $C_1$-$C_{10}$ alkyl group.

In a preferred embodiment, $R^2$ in the recurring units of formula (1) is at least one group selected from groups represented by the general formulae (R²-7) and (R²-8).

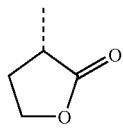 (R⁸-1)

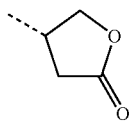 (R⁸-2)

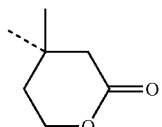 (R⁸-3)

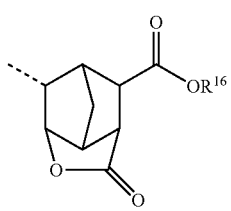 (R⁸-4)

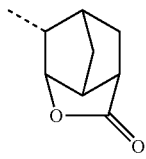 (R⁸-5)

-continued

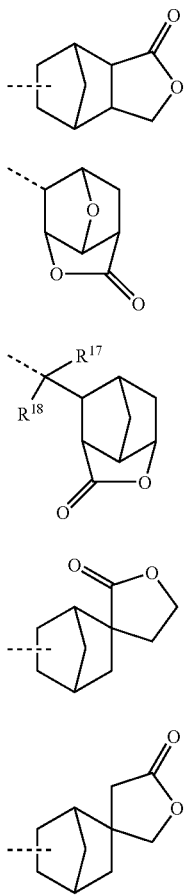

(R⁸-6)

(R⁸-7)

(R⁸-8)

(R⁸-9)

(R⁸-10)

Herein a broken line depicts a bond position, $R^{16}$ is a straight, branched or cyclic $C_1$-$C_{10}$ alkyl group, and $R^{17}$ and $R^{18}$ are each independently hydrogen or a straight, branched or cyclic $C_1$-$C_{10}$ alkyl group, or $R^{17}$ and $R^{18}$, taken together, may form a ring with the carbon atom to which they are bonded.

In a preferred embodiment, the recurring units of formula (2) are included at a molar fraction of 1 to 50%. Also preferably, the recurring units of formulae (1), (3) and (4) are included each at a molar fraction of at least 5%.

In a second aspect, the invention provides a resist composition comprising the polymer defined above.

In a third aspect, the invention provides a process for forming a resist pattern comprising the steps of (i) applying the resist composition onto a substrate to form a coating, (ii) heat treating the coating and then exposing it to high-energy radiation having a wavelength of up to 300 nm or electron beams through a photomask, and (iii) heat treating the exposed coating and developing it with a developer.

The inventive resist composition prepared using the inventive polymer as a base resin lends itself to micropatterning with electron beams or deep UV since it is sensitive to high-energy radiation and is improved in sensitivity, resolution and etching resistance. Especially because of the minimized absorption at the exposure wavelength of an ArF or KrF excimer laser, the composition can be processed by photolithography using such a laser, to form a finely defined pattern having sidewalls perpendicular to the substrate.

DESCRIPTION OF THE PREFERRED EMBODIMENTS

Polymer

The novel polymer of the invention is characterized by comprising recurring units having the general formulae (1), (2), (3) and (4), the recurring units being of at least one type for each formula. The polymer has a weight average molecular weight of 1,000 to 50,000.

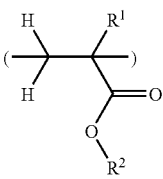

(1)

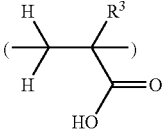

(2)

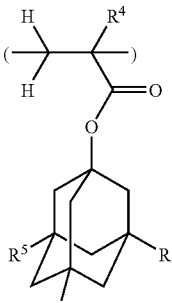

(3)

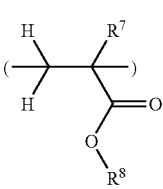

(4)

Herein $R^1$, $R^3$, $R^4$ and $R^7$ are each independently hydrogen or methyl, $R^2$ is an acid labile group, $R^5$ and $R^6$ are each independently hydrogen or hydroxyl, and $R^8$ is a group having a lactone structure.

By introducing an amount of recurring units having an acid labile group represented by formula (1), there is formed a polymer which is decomposed under the action of acid to generate a carboxylic acid and become soluble in alkali. For a minimized line density-dependent size difference, it is advantageous to reduce the amount of recurring units of formula (1). This, however, is made at the expense of resolution. In this regard, by reducing the amount of recurring units of formula (1) introduced and instead, introducing recurring units of formula (2), the line density-dependent size difference can be reduced while maintaining resolution. Recurring units of formula (4) are necessary to impart substrate adhesion and liquid developer affinity. If these recurring units are introduced in more amounts than necessity, there arise several problems that recurring units of formula (1) cause enhancement of line density-dependency, hydrophilic recurring units of formula (2) cause surface roughening due to swelling and shape deficiency due to film slimming, and recurring units of formula (4) cause a lowering of etch resistance and shape deficiency due to film slimming. However, when recurring units of formula (3) are used in combination, the amounts of the other recurring units introduced are accordingly reduced, avoiding the inclusion of recurring units of formulae (1), (2) and (4) in more amounts than necessity. In addition, since recurring units of formula (3) has a rigid adamantane structure as a substituent group, they also contribute to an improvement in etch resistance. Accordingly, only when all recurring units of formulae (1) to (4) are included, the resulting polymer is improved in etch resistance, pattern shape, substrate adhesion, and liquid developer affinity, and satisfies both a high resolution and a minimized line density-dependent size difference and becomes useful in micro-pattern formation.

In the preferred polymer of the invention, $R^2$ in the recurring units of formula (1) is at least one group selected from groups of the general formulae ($R^2$-1) and ($R^2$-2).

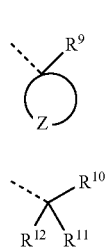

Herein a broken line depicts a bond position. $R^9$, $R^{10}$, $R^{11}$ and $R^{12}$ are each independently a straight, branched or cyclic $C_1$-$C_{12}$ group which may contain an oxygen atom. Exemplary groups include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, 1-norbornyl, 2-norbornyl, 1-adamantyl and 2-adamantyl, modified forms of the foregoing alkyl groups in which at least one methylene is replaced by oxygen to form a chain-like or cyclic ether, and modified forms of the foregoing alkyl groups in which some hydrogen atoms bonded to carbon atoms are replaced by hydroxyl, alkoxy, carboxy, alkoxycarbonyl, oxo or similar groups.

Z is an atom group which forms a cyclic structure or a derivative thereof with the carbon atom to which it is bonded, the cyclic structure being selected from among cyclopentane, cyclohexane, norbornane, adamantane, tricyclo[5.2.1.0$^{2,6}$] decane and tetracyclo[4.4.0.1$^{2,5}$.1$^{7,10}$]dodecane.

Illustrative, non-limiting examples of the recurring units of formula (1) wherein groups of formulae ($R^2$-1) and ($R^2$-2) are introduced are given below.

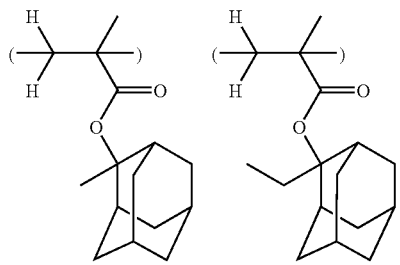

-continued

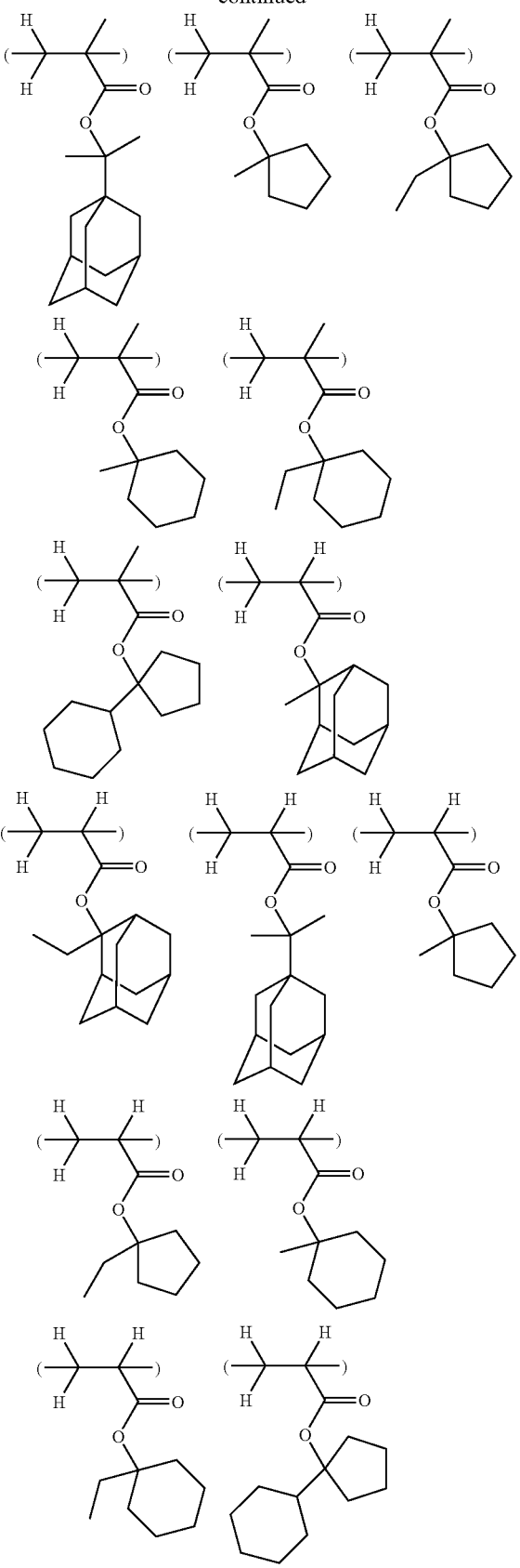

It is noted that when Z in formula (R²-1) forms cyclopentane or cyclohexane with the carbon atom to which it is bonded and R⁹ is an alkyl group having a cyclic structure as exemplified above, the recurring units of formula (1) exhibit a high acid reactivity for the reason described in JP-A 2002-003537. Because a plurality of cyclic structures are incorporated, these recurring units are rigid enough to accomplish a high etch resistance. Therefore, a polymer having these recurring units introduced is improved especially in sensitivity, resolution and etch resistance.

In the recurring units of formula (1), R² is more preferably at least one group selected from among tertiary exo-alkyl groups having a bicyclo[2.2.1]heptane structure, specifically represented by the general formulae (R²-3) to (R²-6).

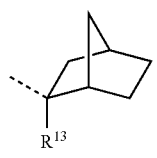
(R²-3)

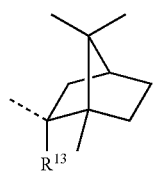
(R²-4)

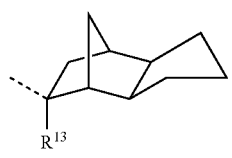
(R²-5)

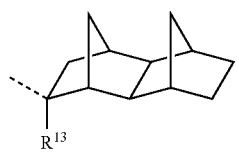
(R²-6)

Herein a broken line depicts a bond position and bond direction. $R^{13}$ is each independently a straight, branched or cyclic $C_1$-$C_{10}$ alkyl group. Exemplary groups include methyl, ethyl, propyl, isopropyl, n-butyl, sec-butyl, tert-butyl, tert-amyl, n-pentyl, n-hexyl, cyclopentyl, and cyclohexyl.

It is noted that formula (R²-5) collectively represents one or a mixture of two selected from among groups represented by the general formulae (R²-5-1) and (R²-5-2).

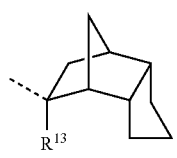
(R²-5-1)

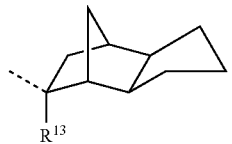
(R²-5-2)

Herein a broken line depicts a bond position and bond direction, and $R^{13}$ is as defined above.

Formula (R²-6) collectively represents one or a mixture of two or more selected from groups represented by the general formulae (R²-6-1) to (R²-6-4).

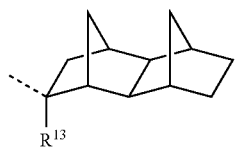
(R²-6-1)

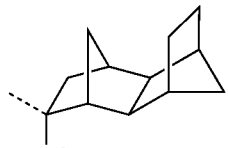
(R²-6-2)

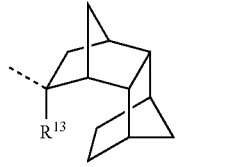
(R²-6-3)

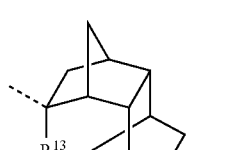
(R²-6-4)

Herein a broken line depicts a bond position and bond direction, and $R^{13}$ is as defined above.

Also, each of formulae (R²-3) to (R²-6), (R²-5-1), (R²-5-2), and (R²-6-1) to (R²-6-4) collectively represents an enantiomer thereof and a mixture of enantiomers.

Due to the fact that the direction of a valence bond in each of formulae (R²-3) to (R²-6), (R²-5-1), (R²-5-2), and (R²-6-1) to (R²-6-4) is on the exo side relative to the bicyclo[2.2.1] heptane ring, a high reactivity in acid-catalyzed elimination reaction is accomplished (see JP-A 2000-336121). When a monomer substituted with a tertiary exo-alkyl group having a-bicyclo[2.2.1]heptane structure is prepared, the product may also contain a monomer substituted with an endo-alkyl group represented by the following general formulae (R²-3-endo) to (R²-6-endo). To ensure satisfactory reactivity, the exo proportion is preferably at least 50 mol %, and more preferably at least 80 mol % of the product.

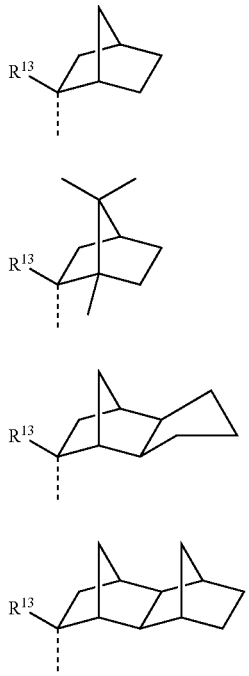

(R²-3-endo)

(R²-4-endo)

(R²-5-endo)

(R²-6-endo)

In formulae (R²-3-endo) to (R²-6-endo), a broken line depicts a bond position and bond direction, and R¹³ is as defined above.

Illustrative, non-limiting examples of the recurring units of formula (1) having groups of formulae (R²-3) to (R²-6) introduced therein are given below.

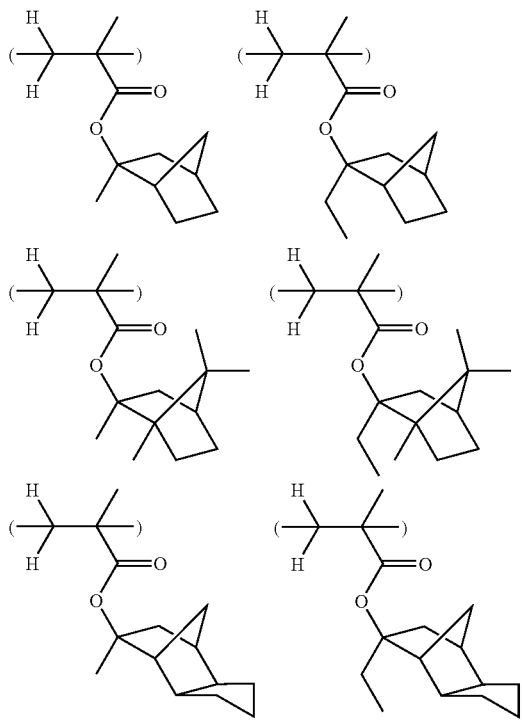

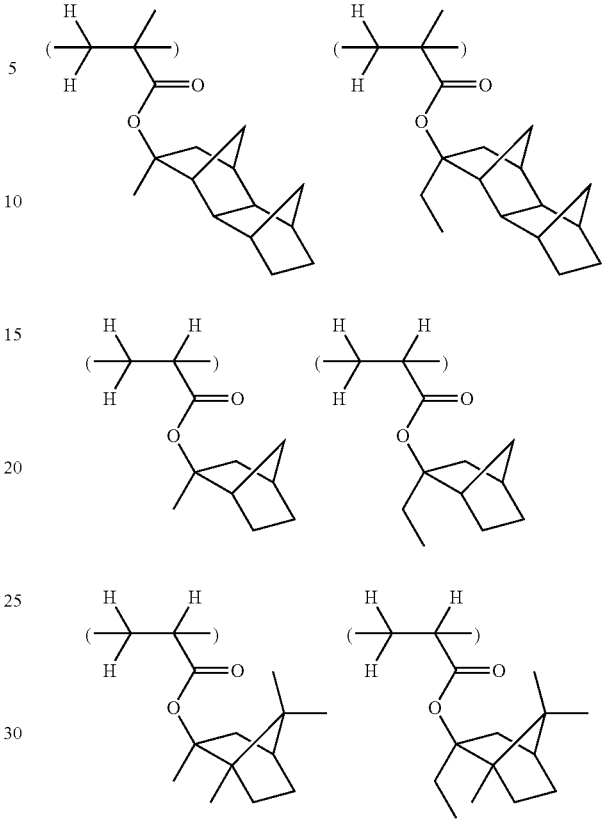

Polymers having groups of formulae (R²-3) to (R²-6) introduced therein have high acid reactivity as mentioned above and improved etch resistance due to the bridged cyclic structure. Accordingly, resist compositions comprising the polymers have improved sensitivity, resolution and etch resistance and are best suited in micro-pattern formation.

In the recurring units of formula (1), R² also preferably represents groups of the following general formulae (R²-7) and (R²-8).

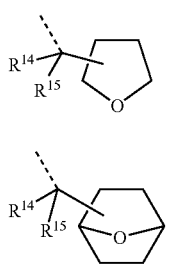

(R²-7)

(R²-8)

Herein a broken line depicts a bond position. $R^{14}$ and $R^{15}$ are each independently a straight, branched or cyclic $C_1$-$C_{10}$ alkyl group. Alternatively, $R^{14}$ and $R^{15}$, taken together, may form a ring with the carbon atom to which they are bonded. The rings are typically of 3 to 20 carbon atoms, preferably 3 to 10 carbon atoms, for example, cyclopentyl and cyclohexyl.

Illustrative, non-limiting examples of the recurring units of formula (1) having groups of formulae (R²-7) and (R²-8) introduced therein are given below.

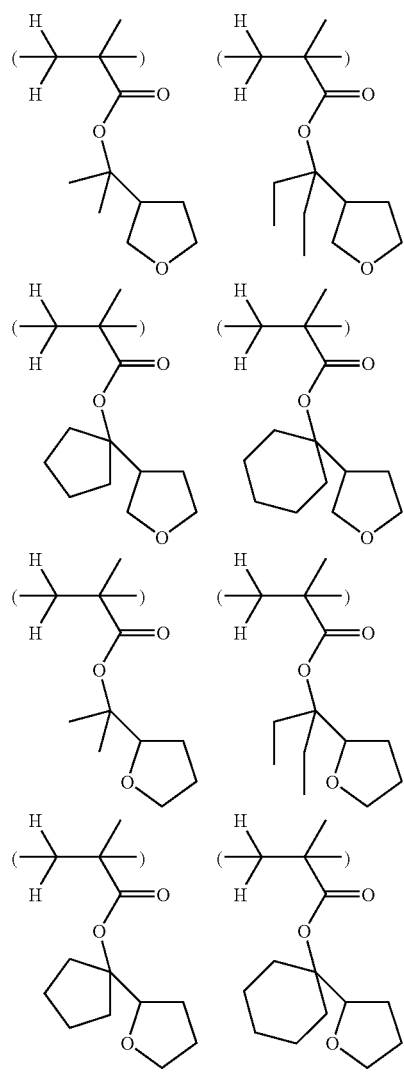

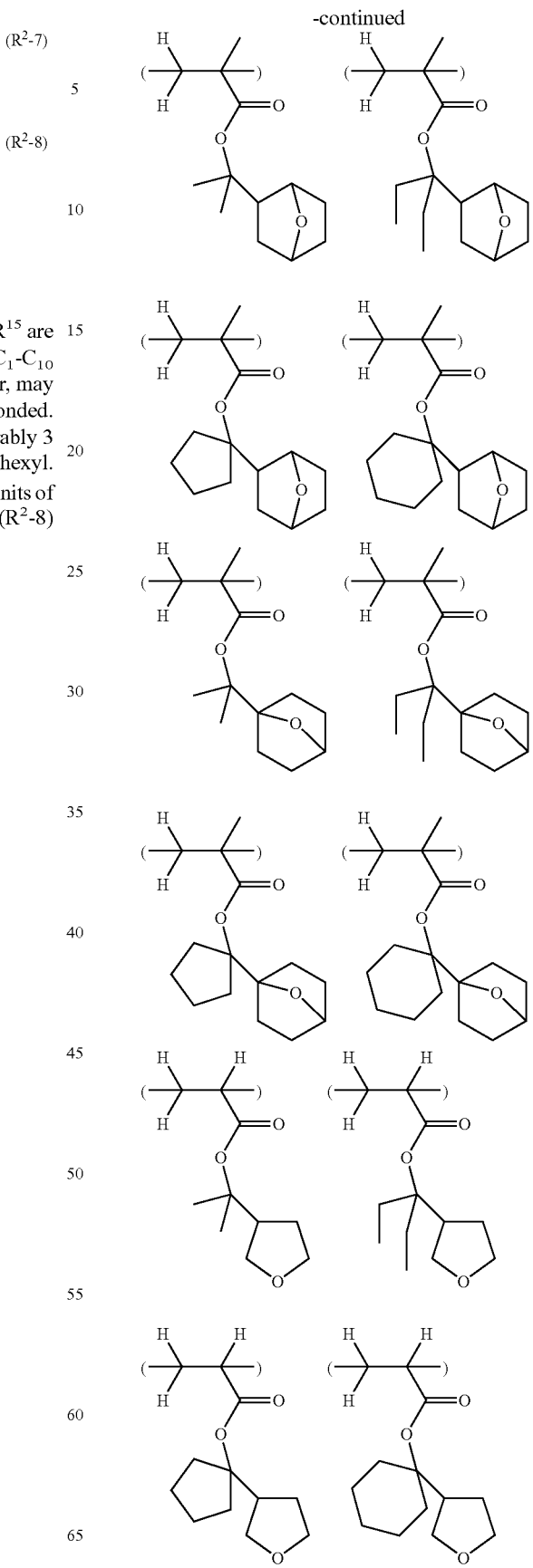

-continued

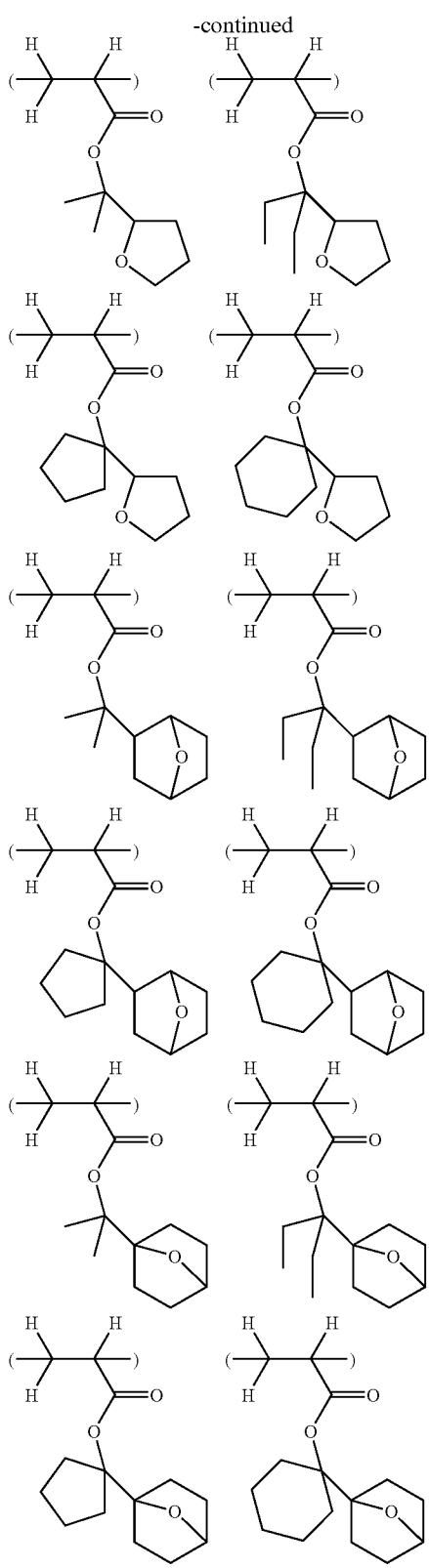

Since a copolymer of acrylic or methacrylic acid derivative has low etch resistance, a certain amount of units containing a rigid group having a number of carbon atoms such as an adamantane structure must be introduced therein to compen- sate for that drawback. Then the polymer becomes highly hydrophobic as a whole and undergoes swelling upon development, resulting in pattern collapse and surface roughening. Using oxygen atom-containing groups of formulae ($R^2$-7) and ($R^2$-8), the polymer is made more hydrophilic, which restrains swelling upon development, eliminating pattern collapse and surface roughening. Since these groups have an alicyclic structure, a practical level of etch resistance is achieved. Therefore, a resist composition comprising the polymer is free of pattern collapse and surface roughening upon development, has a practical level of etch resistance and is very useful in micro-pattern formation.

Illustrative examples of the recurring units of formula (3) are given below.

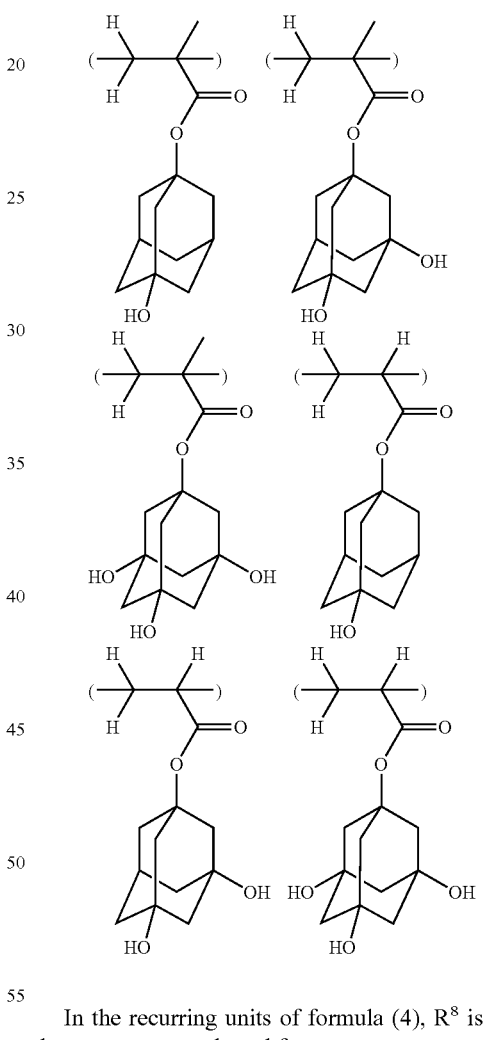

In the recurring units of formula (4), $R^8$ is preferably at least one group selected from among groups represented by the following general formulae ($R^8$-1) to ($R^8$-10).

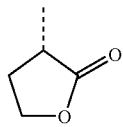

($R^8$-1)

-continued (R⁸-2) 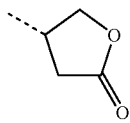

(R⁸-3) 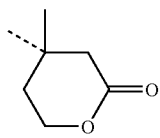

(R⁸-4) 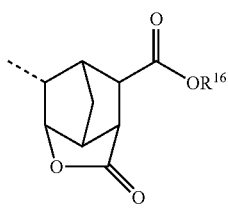

(R⁸-5) 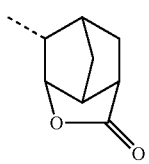

(R⁸-6) 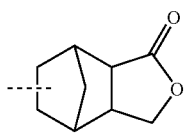

(R⁸-7) 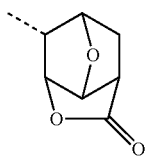

(R⁸-8) 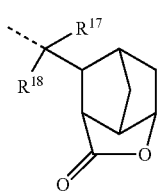

(R⁸-9) 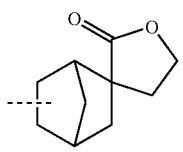

(R⁸-10) 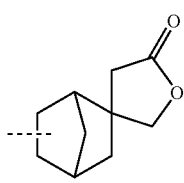

Herein a broken line depicts a bond position. $R^{16}$ is a straight, branched or cyclic $C_1$-$C_{10}$ alkyl group. Exemplary groups include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl and adamantyl. $R^{17}$ and $R^{18}$ are each independently hydrogen or a straight, branched or cyclic $C_1$-$C_{10}$ alkyl group. Alternatively, $R^{17}$ and $R^{18}$, taken together, may form a ring with the carbon atom to which they are bonded. Examples of the straight, branched or cyclic $C_1$-$C_{10}$ alkyl group represented by $R^{17}$ and $R^{18}$ include methyl, ethyl, propyl, isopropyl, n-butyl, sec-butyl, tert-butyl, n-pentyl, n-hexyl, cyclohexyl, and n-decyl. When $R^{17}$ and $R^{18}$ bond together to form a ring, examples of the alkylene group they form are those forming a ring of 3 to 20 carbon atoms, especially 3 to 10 carbon atoms, such as ethylene, propylene, trimethylene and tetramethylene.

Illustrative, non-limiting examples of the recurring units of formula (4) having groups of formulae ($R^8$-1) to ($R^8$-10) introduced therein are given below.

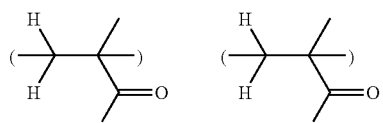

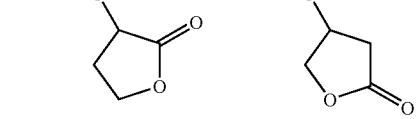

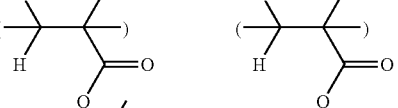

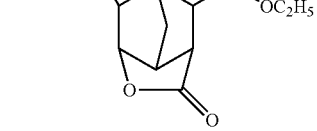

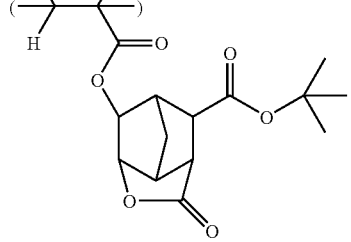

-continued
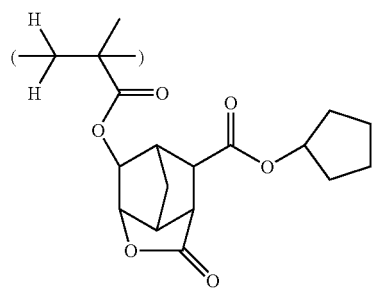
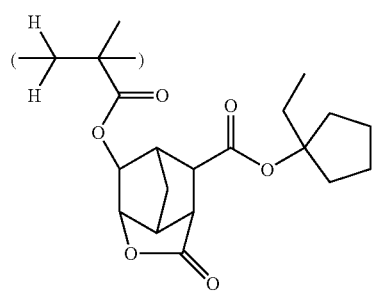
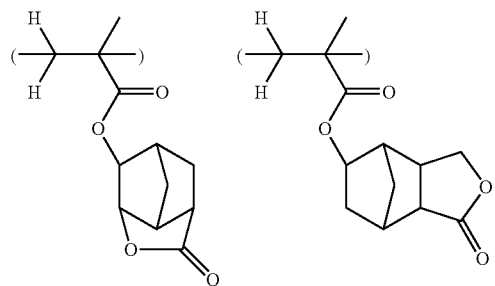
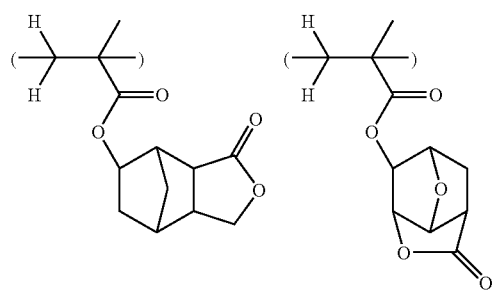
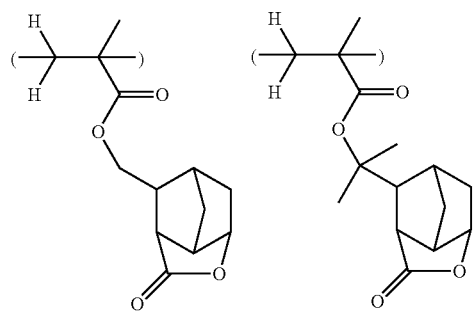
-continued
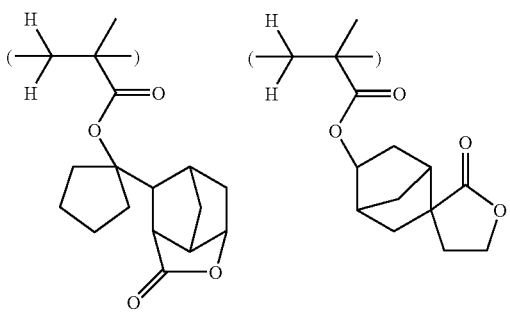
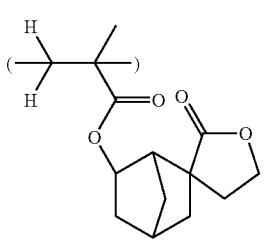
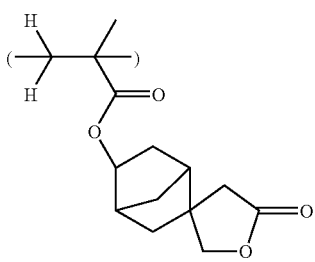
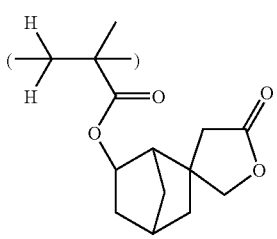
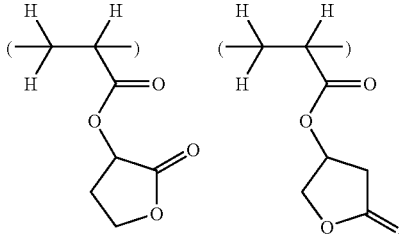
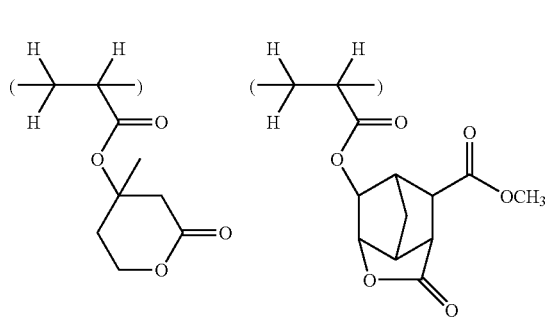

-continued

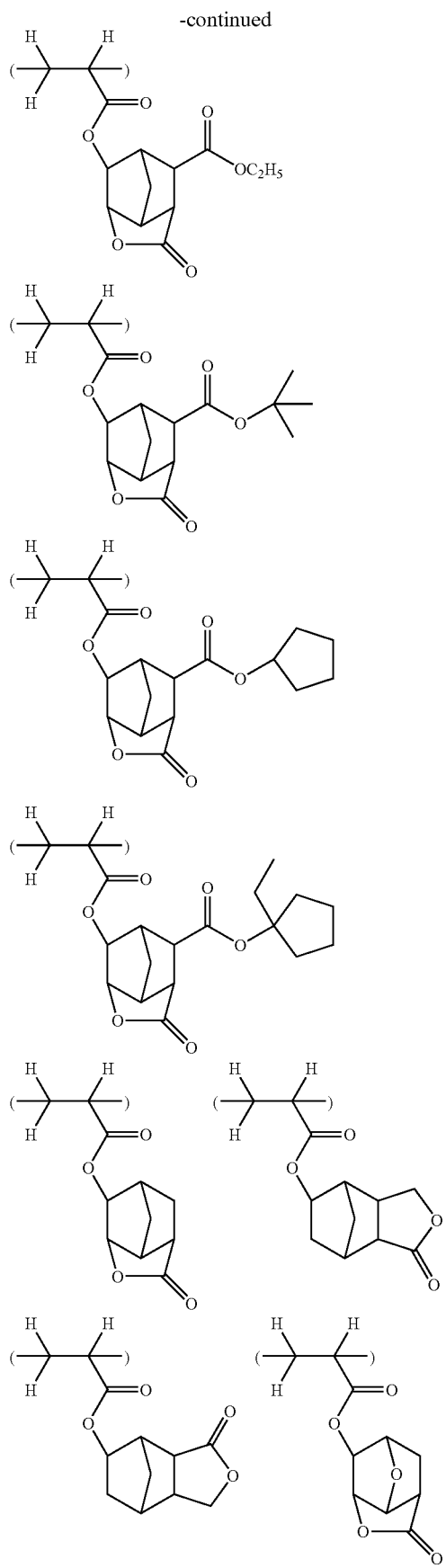

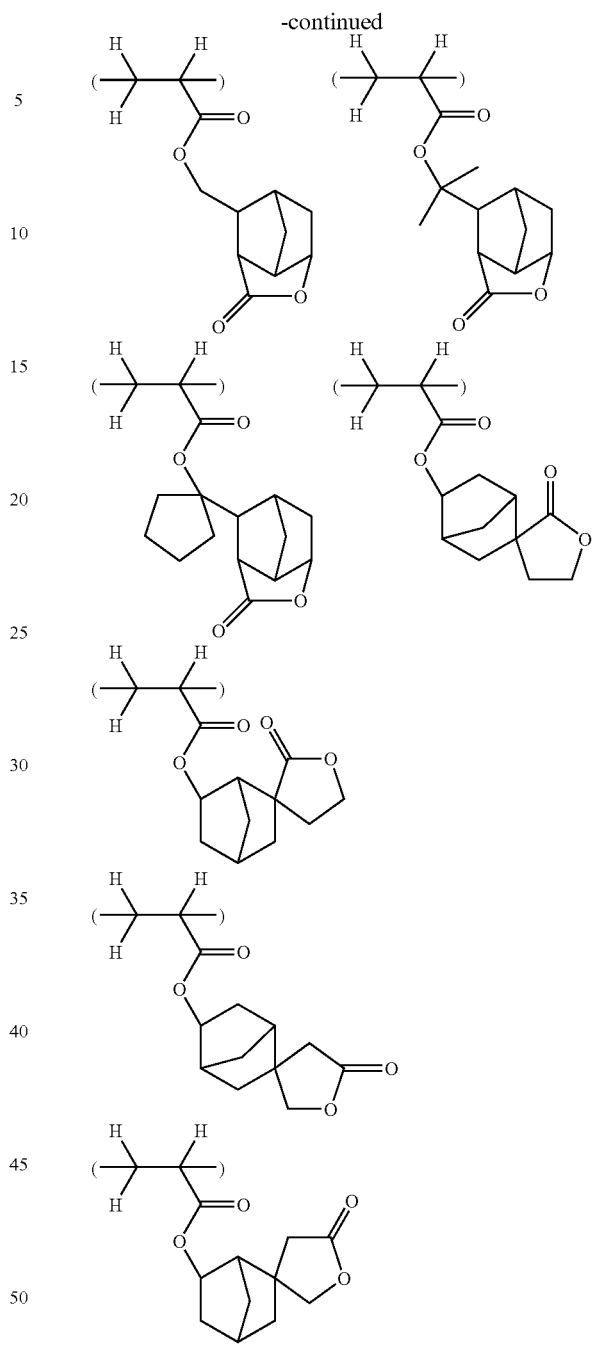

By introducing recurring units of formula (4) into a polymer to be used as a resist material, the polymer is endowed with substrate adhesion and liquid developer affinity. When recurring units of formula (2) are introduced, there is a tendency that the pattern surface is roughened by swelling during development. This can be avoided by introducing recurring units of formula (4) to increase the polarity of the polymer and impart an appropriate degree of liquid developer affinity. The groups represented by formulae ($R^8$-1) to ($R^8$-3) are so polar that they are highly hydrophilic and very effective in suppressing the polymer from being swollen during development and preventing surface roughening after development. On the other hand, the groups having a bridged ring structure represented by formulae ($R^8$-4) to ($R^8$-10) are moderate in the effect of preventing surface roughening, but quite good in etch resistance. Of these, the group represented by formula ($R^8$-7) in which an oxygen functional group is effectively situated within the cyclic structure is effective for minimizing a reduction of dry etch resistance by a lowering of carbon density, and has a high polarity and a significant improvement in liquid developer affinity, enabling to satisfy both high etch resistance and swelling suppression. Consequently, the group represented by formula ($R^8$-7) is best suited among the lactone structures represented by formulae ($R^8$-1) to ($R^8$-10).

As discussed above, by suitably selecting a lactone structure in compliance with the properties of recurring units of formula (1) used in combination, a balance can be established among substrate adhesion, the swelling preventing effect due to improved liquid developer affinity, and etch resistance.

In a more preferred polymer of the invention, $R^2$ in the recurring units of formula (1) is at least one group selected from among groups represented by formulae ($R^2$-3) to ($R^2$-6) and at least one group selected from among groups represented by formulae ($R^2$-7) and ($R^2$-8).

In a more preferred polymer of the invention, $R^2$ in the recurring units of formula (1) is at least one group selected from among groups represented by formulae ($R^2$-1) and ($R^2$-2), and $R^8$ in the recurring units of formula (4) is at least one group selected from among groups represented by formulae ($R^8$-1) to ($R^8$-10).

In a more preferred polymer of the invention, $R^2$ in the recurring units of formula (1) is at least one group selected from among groups represented by formulae ($R^2$-3) to ($R^2$-6), and $R^8$ in the recurring units of formula (4) is at least one group selected from among groups represented by formulae ($R^8$-1) to ($R^8$-10).

In a more preferred polymer of the invention, $R^2$ in the recurring units of formula (1) is at least one group selected from among groups represented by formulae ($R^2$-7) and ($R^2$-8), and $R^8$ in the recurring units of formula (4) is at least one group selected from among groups represented by formulae ($R^8$-1) to ($R^8$-10).

In a more preferred polymer of the invention, $R^2$ in the recurring units of formula (1) is at least one group selected from among groups represented by formulae ($R^2$-3) to ($R^2$-6) and at least one group selected from among groups represented by formulae ($R^2$-7) and ($R^2$-8), and $R^8$ in the recurring units of formula (4) is at least one group selected from among groups represented by formulae ($R^8$-1) to ($R^8$-10).

In the inventive polymer, the recurring units of formula (2) are preferably included at a molar fraction of from 1% to 50%, more preferably from 3% to 45%, and even more preferably from 5% to 40%.

In the inventive polymer, the recurring units of formulae (1), (3) and (4) are preferably included each at a molar fraction of at least 5%, more preferably at least 8%, and even more preferably at least 10%.

If desired, the polymers of the invention may further contain recurring units of one or more types selected from among units of the following general formulae (M1) to (M9).

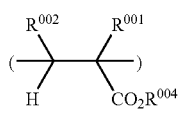

(M1)

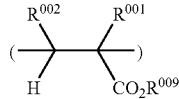

(M2)

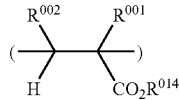

(M3)

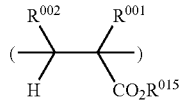

(M4)

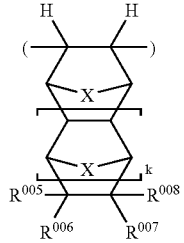

(M5)

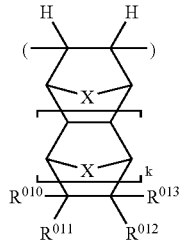

(M6)

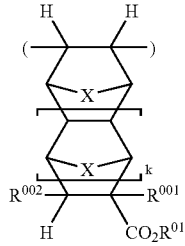

(M7)

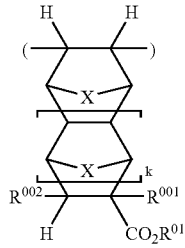

(M8)

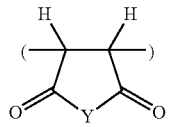

(M9)

Herein, $R^{001}$ is hydrogen, methyl or $CH_2CO_2R^{003}$. $R^{002}$ is hydrogen, methyl or $CO_2R^{003}$. $R^{003}$ is a straight, branched or cyclic $C_1$-$C_{15}$ alkyl group. $R^{004}$ is hydrogen or a monovalent $C_1$-$C_{15}$ hydrocarbon group having a carboxyl or hydroxyl group. At least one of $R^{005}$ to $R^{008}$ represents a monovalent $C_1$-$C_{15}$ hydrocarbon group having a carboxyl or hydroxyl group while the remaining R's independently represent hydrogen or a straight, branched or cyclic $C_1$-$C_{15}$ alkyl group. Alternatively, $R^{005}$ to $R^{008}$, taken together, may form a ring, and in that event, at least one of $R^{005}$ to $R^{008}$ is a divalent $C_1$-$C_{15}$ hydrocarbon group having a carboxyl or hydroxyl group, while the remaining R's are independently single bonds or straight, branched or cyclic $C_1$-$C_{15}$ alkylene groups. $R^{009}$ is a monovalent $C_3$-$C_{15}$ hydrocarbon group having a —$CO_2$— partial structure. At least one of $R^{010}$ to $R^{013}$ is a monovalent $C_2$-$C_{15}$ hydrocarbon group having a —$CO_2$— partial structure, while the remaining R's are independently hydrogen or straight, branched or cyclic $C_1$-$C_{15}$ alkyl groups. $R^{010}$ to $R^{013}$, taken together, may form a ring, and in that event, at least one of $R^{010}$ to $R^{013}$ is a divalent $C_1$-$C_{15}$ hydrocarbon group having a —$CO_2$— partial structure, while the remaining R's are independently single bonds or straight, branched or cyclic $C_1$-$C_{15}$ alkylene groups. $R^{014}$ is a polycyclic hydrocarbon group of 7 to 15 carbon atoms or an alkyl group containing a polycyclic hydrocarbon group. $R^{015}$ is an acid labile group. X is $CH_2$ or an oxygen atom. Y is —O— or —($NR^{016}$)— wherein $R^{016}$ is hydrogen or a straight, branched or cyclic $C_1$-$C_{15}$ alkyl group. Letter k is equal to 0 or 1.

More illustratively, $R^{001}$ is hydrogen, methyl or $CH_2CO_2R^{003}$. $R^{002}$ is hydrogen, methyl or $CO_2R^{003}$. $R^{003}$ is a straight, branched or cyclic $C_1$-$C_{15}$ alkyl group, for example, methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent $C_1$-$C_{15}$ hydrocarbon group having a carboxyl or hydroxyl group, for example, hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, and hydroxyadamantyl.

At least one of $R^{005}$ to $R^{008}$ represents a monovalent $C_1$-$C_{15}$ hydrocarbon group having a carboxyl or hydroxyl group while the remaining R's independently represent hydrogen or a straight, branched or cyclic $C_1$-$C_{15}$ alkyl group. Examples of the carboxyl or hydroxyl-bearing monovalent $C_1$-$C_{15}$ hydrocarbon group include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, and hydroxyadamantyloxycarbonyl. Examples of the straight, branched or cyclic $C_1$-$C_{15}$ alkyl group are the same as exemplified for $R^{003}$.

Alternatively, $R^{005}$ to $R^{008}$, taken together, may form a ring. In that event, at least one of $R^{005}$ to $R^{008}$ is a divalent $C_1$-$C_{15}$ hydrocarbon group having a carboxyl or hydroxyl group, while the remaining R's are independently single bonds or straight, branched or cyclic $C_1$-$C_{15}$ alkylene groups. Examples of the carboxyl or hydroxyl-bearing divalent $C_1$-$C_{15}$ hydrocarbon group include the groups exemplified as the carboxyl or hydroxyl-bearing monovalent hydrocarbon group, with one hydrogen atom eliminated therefrom. Examples of the straight, branched or cyclic $C_1$-$C_{15}$ alkylene groups include the groups exemplified for $R^{003}$, with one hydrogen atom eliminated therefrom.

$R^{009}$ is a monovalent $C_3$-$C_{15}$ hydrocarbon group containing a —$CO_2$— partial structure, for example, 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ is a monovalent $C_2$-$C_{15}$ hydrocarbon group containing a —$CO_2$— partial structure, while the remaining R's are independently hydrogen or straight, branched or cyclic $C_1$-$C_{15}$ alkyl groups. Examples of the monovalent $C_2$-$C_{15}$ hydrocarbon group containing a —$CO_2$— partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Examples of the straight, branched or cyclic $C_1$-$C_{15}$ alkyl groups are the same as exemplified for $R^{003}$.

$R^{010}$ to $R^{013}$, taken together, may form a ring. In that event, at least one of $R^{010}$ to $R^{013}$ is a divalent $C_1$-$C_{15}$ hydrocarbon group containing a —$CO_2$— partial structure, while the remaining R's are independently single bonds or straight, branched or cyclic $C_1$-$C_{15}$ alkylene groups. Examples of the divalent $C_1$-$C_{15}$ hydrocarbon group containing a —$CO_2$— partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as the groups exemplified as the monovalent $C_1$-$C_{15}$ hydrocarbon group containing a —$CO_2$— partial structure, with one hydrogen atom eliminated therefrom. Examples of the straight, branched or cyclic $C_1$-$C_{15}$ alkylene groups include the groups exemplified for $R^{003}$, with one hydrogen atom eliminated therefrom.

$R^{014}$ is a polycyclic hydrocarbon group of 7 to 15 carbon atoms or an alkyl group containing a polycyclic hydrocarbon group, for example, norbornyl, bicyclo[3.3.1]nonyl, tricyclo[5.2.1.0$^{2,6}$]decyl, adamantyl, ethyladamantyl, butyladamantyl, norbornylmethyl, and adamantylmethyl.

$R^{015}$ is an acid labile group, which will be described later. X is $CH_2$ or an oxygen atom. Y is —O— or —($NR^{016}$)— wherein $R^{016}$ is hydrogen or a straight, branched or cyclic $C_1$-$C_{15}$ alkyl group, such as, for example, methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl and butyladamantyl. Letter k is equal to 0 or 1.

The acid labile groups represented by $R^{015}$ may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

(L1)

(L2)

-continued

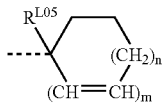
(L3)

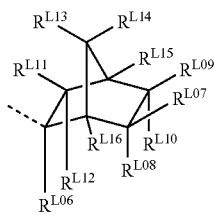
(L4)

In these formulae, a broken line denotes a bond position and bond direction. $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and straight, branched or cyclic alkyl groups in which some hydrogen atoms are replaced by hydroxyl, alkoxy, oxo, amino, alkylamino or the like. Illustrative examples are the substituted alkyl groups shown below.

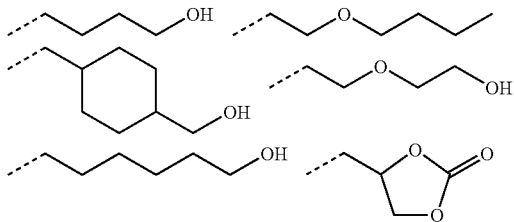

In these formulae, a broken line denotes a bond position. A pair of $R^{L01}$ and $R^{L02}$, $R^{L01}$ and $R^{L03}$, or $R^{L02}$ and $R^{L03}$ may form a ring. Each of $R^{L01}$, $R^{L02}$ and $R^{L03}$ is a straight or branched alkylene group of 1 to 18 carbon atoms, preferably 1 to 10 carbon atoms when they form a ring.

$R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

$R^{L05}$ is a monovalent $C_1$-$C_8$ hydrocarbon group which may contain a hetero atom or a substituted or unsubstituted $C_6$-$C_{20}$ aryl group. Examples of the monovalent hydrocarbon group which may contain a hetero atom include straight, branched or cyclic alkyl groups such as methyl, ethyl, propyl, isopropyl, n-butyl, sec-butyl, tert-butyl, tert-amyl, n-pentyl, n-hexyl, cyclopentyl, and cyclohexyl, and substituted groups in which some hydrogen atoms on the foregoing groups are substituted with hydroxyl, alkoxy, carboxy, alkoxycarbonyl, oxo, amino, alkylamino, cyano, mercapto, alkylthio, sulfo or other groups. Exemplary aryl groups are phenyl, methylphenyl, naphthyl, anthryl, phenanthryl, and pyrenyl. Letter m is equal to 0 or 1, n is equal to 0, 1, 2 or 3, and 2m+n is equal to 2 or 3.

$R^{L06}$ is a monovalent $C_1$-$C_8$ hydrocarbon group which may contain a hetero atom or a substituted or unsubstituted $C_6$-$C_{20}$ aryl group. Examples of these groups are the same as exemplified for $R^{L05}$.

$R^{L07}$ to $R^{L16}$ independently represent hydrogen or monovalent $C_1$-$C_{15}$ hydrocarbon groups which may contain a hetero atom. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted ones of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, $R^{L07}$ to $R^{L16}$, taken together, form a ring (for example, a pair of $R^{L07}$ and $R^{L08}$, $R^{L07}$ and $R^{L09}$, $R^{L08}$ and $R^{L10}$ $R^{L09}$ and $R^{L10}$ $R^{L11}$ $R^{L12}$, $R^{L13}$ and $R^{L14}$, or a similar pair form a ring). Each of $R^{L07}$ to $R^{L16}$ represents a divalent $C_1$-$C_{15}$ hydrocarbon group which may contain a hetero atom, when they form a ring, examples of which are the ones exemplified above for the monovalent hydrocarbon groups, with one hydrogen atom being eliminated. Two of $R^{L07}$ to $R^{L10}$ which are attached to adjoining carbon atoms (for example, a pair of $R^{L07}$ and $R^{L09}$, or a similar pair) may bond together directly to form a double bond.

Of the acid labile groups of formula (L1), the straight and branched ones are exemplified by the following groups.

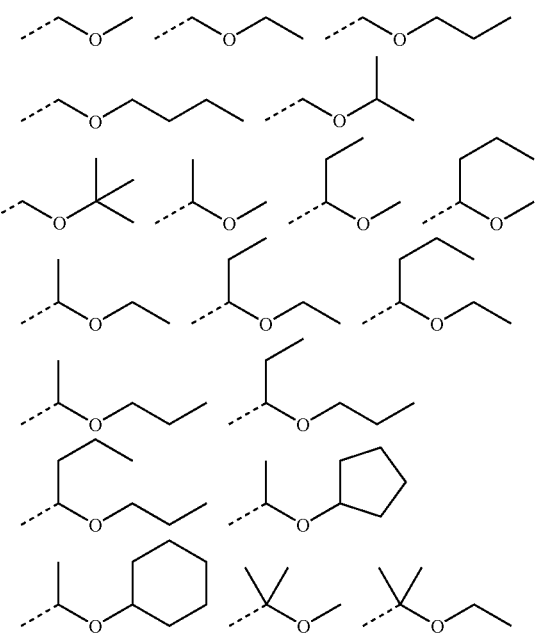

Herein, a broken line denotes a bond position.

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

The acid labile groups of formula (L4) are exemplified by the following groups.

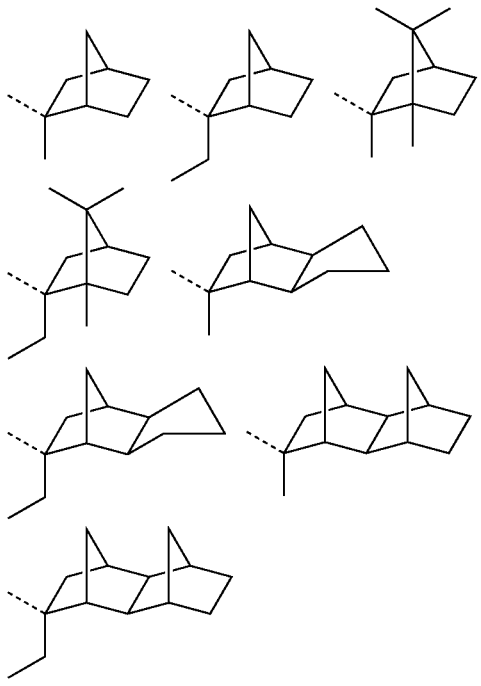

Herein, a broken line denotes a bond position and bond direction.

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups are as exemplified for $R^{L04}$.

The recurring units of formulae (M1) to (M9) are effective for imparting such desired properties as developer affinity, substrate adhesion and etching resistance to a resist composition based on a polymer comprising these recurring units. By adjusting the content of these recurring units, the performance of the resist composition can be finely adjusted.

The polymers of the invention have a weight average molecular weight (Mw) of about 1,000 to 50,000, preferably about 2,000 to 30,000, as measured by gel permeation chromatography (GPC) using polystyrene standards. Outside the range, the etching resistance may become extremely low and the resolution may become low because a substantial difference in rate of dissolution before and after exposure is lost.

The polymer of the invention can be prepared through copolymerization reaction using at least one monomer selected from compounds of the following general formula (1a), at least one monomer selected from compounds of the following general formula (2a), at least one monomer selected from compounds of the following general formula (3a), at least one monomer selected from compounds of the following general formula (4a), and optionally, at least one monomer selected from compounds of the following general formulae (M1a) to (M9a).

(1a)

(2a)

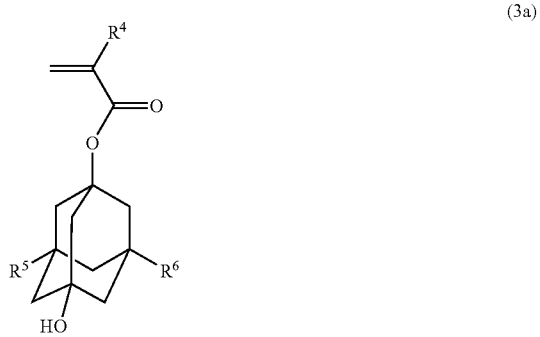

(3a)

(4a)

Herein, $R^1$ to $R^8$ are as defined above.

(M1a)

(M2a)

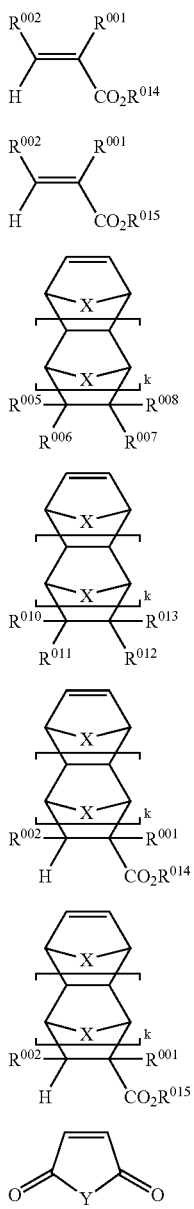

Herein, k, R$^{001}$ to R$^{015}$, X, and Y are as defined above.

By properly adjusting the proportion of the respective monomers used in the copolymerization reaction, the polymer can be tailored so that it may exert the preferred performance when blended in resist compositions.

In addition to (i) at least one monomer of formula (1a), (ii) at least one monomer of formula (2a), (iii) at least one monomer of formula (3a), (iv) at least one monomer of formula (4a), and (v) at least monomer of formulae (M1a) to (M9a), the polymer of the invention may have copolymerized therewith (vi) another monomer having a carbon-to-carbon double bond other than (i) to (v). Examples of the additional monomer (vi) include substituted acrylic acid esters such as methyl methacrylate, methyl crotonate, dimethyl maleate, and dimethyl itaconate, unsaturated carboxylic acids such as maleic acid, fumaric acid and itaconic acid, substituted or unsubstituted norbornenes such as norbornene and methyl norbornene-5-carboxylate, unsaturated acid anhydrides such as itaconic anhydride, and α,β-unsaturated lactones such as 5,5-dimethyl-3-methylene-2-oxotetrahydrofuran.

In the polymers of the invention, the preferred proportion of recurring units derived from the respective monomers is, but not limited to, in the following range:

(i) 5 to 90 mol %, preferably 8 to 80 mol %, and more preferably 10 to 70 mol % when recurring units of one type of formula (1) derived from the monomer of formula (1a) are used, and 5 to 90 mol %, preferably 8 to 80 mol %, and more preferably 10 to 70 mol % in total when recurring units of more than one type of formula (1) derived from the monomers of formula (1a) are used, (ii) 1 to 50 mol %, preferably 3 to 45 mol %, and more preferably 5 to 40 mol % when recurring units of one type of formula (2) derived from the monomer of formula (2a) are used, and 1 to 50 mol %, preferably 3 to 45 mol %, and more preferably 5 to 40 mol % in total when recurring units of more than one type of formula (2) derived from the monomers of formula (2a) are used, (iii) 5 to 80 mol %, preferably 8 to 70 mol %, and more preferably 10 to 60 mol % when recurring units of one type of formula (3) derived from the monomer of formula (3a) are used, and 5 to 80 mol %, preferably 8 to 70 mol %, and more preferably 10 to 60 mol % in total when recurring units of more than one type of formula (3) derived from the monomers of formula (3a) are used, (iv) 5 to 80 mol %, preferably 8 to 75 mol %, and more preferably 10 to 70 mol % when recurring units of one type of formula (4) derived from the monomer of formula (4a) are used, and 5 to 80 mol %, preferably 8 to 75 mol %, and more preferably 10 to 70 mol % in total when recurring units of more than one type of formula (4) derived from the monomers of formula (4a) are used, (v) 0 to 60 mol %, preferably 0 to 40 mol %, and more preferably 0 to 30 mol % when recurring units of one type of formulae (M1) to (M9) derived from the monomer of formulae (M1a) to (M9a) are used, and 0 to 60 mol %, preferably 0 to 40 mol %, and more preferably 0 to 30 mol % in total when recurring units of more than one type of formulae (M1) to (M9) derived from the monomers of formulae (M1a) to (M9a) are used, and (vi) 0 to 60 mol %, preferably 0 to 40 mol %, and more preferably 0 to 30 mol % when recurring units of one type derived from another monomer are used, and 0 to 60 mol %, preferably 0 to 40 mol %, and more preferably 0 to 30 mol % in total when recurring units of more than one type derived from other monomers are used.

The monomer of formula (1a) from which the units of formula (1) included essentially in the inventive polymers originate may be a commercially available compound as such and can be prepared by well-known organochemical procedures. In particular, monomers having substituent groups (R$^2$-3) to (R$^2$-6) can be prepared by the method of JP-A 2000-336121, and monomers having substituent groups (R$^2$-7) and (R$^2$-8) can be prepared by the method of JP-A 2002-285161. The monomer of formula (2a) from which the units of formula (2) originate may be a commercially available compound as such. The monomer of formula (3a) from which the units of formula (3) originate may be a commercially available compound as such and can be prepared by well-known organochemical procedures. The monomer of formula (4a) from which the units of formula (4) originate may be a commercially available compound as such and can be prepared by well-known organochemical procedures. In particular, monomers having substituent groups (R$^8$-4), (R$^8$-5) and (R$^8$-7) can be prepared by the method of JP-A 2000-159758, monomers having a substituent group ($R^8$-8) can be prepared by the method of JP-A 2003-002883 and JP-A 2004-115486, and monomers having substituent groups ($R^8$-9) and ($R^8$-10) can be prepared by the method of JP-A 2002-371114.

A variety of copolymerization reaction methods may be used for the preparation of the polymer according to the invention. The preferred polymerization reaction is radical polymerization. For radical polymerization, preferred reaction conditions include (a) a solvent selected from among hydrocarbons such as benzene, ethers such as tetrahydrofuran, alcohols such as ethanol, and ketones such as methyl isobutyl ketone, (b) a polymerization initiator selected from azo compounds such as 2,2'-azobisisobutyronitrile and peroxides such as benzoyl peroxide and lauroyl peroxide, (c) a temperature of about 0° C. to about 100° C., and (d) a time of about 0.5 hour to about 48 hours. Reaction conditions outside the described range may be employed if desired.

Resist Composition

Since the polymer of the invention is useful as the base resin of a resist composition, the other aspect of the invention provides a resist composition, especially a chemically amplified positive resist composition, comprising the polymer. Typically, the resist composition contains the polymer, a photoacid generator, and an organic solvent, and other optional components.

Photoacid generator

The photoacid generator may be any compound capable of generating an acid upon exposure to high energy radiation or electron beams. Preferred photoacid generators include sulfonium salts, iodonium salts, sulfonyldiazomethanes, and N-sulfonyloxyimides. These photoacid generators are illustrated below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, and 2-oxo-2-phenylethylthiacyclopentanium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodonium salts are salts of iodonium cations with sulfonates. Exemplary iodonium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bis-sulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide structures with sulfonates. Exemplary imide structures are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, fluoroglycinol, catechol, resorcinol, and hydroquinone, in which all the hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonates, 2-nitrobenzyl sulfonates, and 2,6- dinitrobenzyl sulfonates, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone photoacid generators include
bis(phenylsulfonyl)methane,
bis(4-methylphenylsulfonyl)methane,
bis(2-naphthylsulfonyl)methane,
2,2-bis(phenylsulfonyl)propane,
2,2-bis(4-methylphenylsulfonyl)propane,
2,2-bis(2-naphthylsulfonyl)propane,
2-methyl-2-(p-toluenesulfonyl)propiophenone,
2-cyclohexylcarbonyl-2-(p-toluenesulfonyl)propane, and
2,4-dimethyl-2-(p-toluenesulfonyl)pentan-3-one.

Photoacid generators in the form of glyoxime derivatives are as described in Japanese Patent No. 2,906,999 and JP-A 9-301948. Examples include
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(methanesulfonyl)-α-dimethylglyoxime,
bis-O-(trifluoromethanesulfonyl)-α-dimethylglyoxime,
bis-O-(2,2,2-trifluoroethanesulfonyl)-α-dimethylglyoxime,
bis-O-(10-camphorsulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-trifluoromethylbenzenesulfonyl)-α-dimethylglyoxime,
bis-O-(xylenesulfonyl)-α-dimethylglyoxime,
bis-O-(trifluoromethanesulfonyl)-nioxime,
bis-O-(2,2,2-trifluoroethanesulfonyl)-nioxime,
bis-O-(10-camphorsulfonyl)-nioxime,
bis-O-(benzenesulfonyl)-nioxime,
bis-O-(p-fluorobenzenesulfonyl)-nioxime,
bis-O-(p-trifluoromethylbenzenesulfonyl)-nioxime, and
bis-O-(xylenesulfonyl)-nioxime.

Also included are the oxime sulfonates described in U.S. Pat. No. 6,004,724, for example,
(5-(4-toluenesulfonyl)oxyimino-5H-thiophen-2-ylidene)phenyl-acetonitrile,
(5-(10-camphorsulfonyl)oxyimino-5H-thiophen-2-ylidene)phenyl-acetonitrile,
(5-n-octanesulfonyloxyimino-5H-thiophen-2-ylidene)phenyl-acetonitrile,
(5-(4-toluenesulfonyl)oxyimino-5H-thiophen-2-ylidene)(2-methylphenyl)acetonitrile,
(5-(10-camphorsulfonyl)oxyimino-5H-thiophen-2-ylidene)(2-methylphenyl)acetonitrile,
(5-n-octanesulfonyloxyimino-5H-thiophen-2-ylidene)(2-methylphenyl)acetonitrile, etc.

Also included are the oxime sulfonates described in U.S. Pat. No. 6,261,738 and JP-A 2000-314956, for example,
2,2,2-trifluoro-1-phenyl-ethanone oxime-O-methylsulfonate;
2,2,2-trifluoro-1-phenyl-ethanone oxime-O-(10-camphorylsulfonate);
2,2,2-trifluoro-1-phenyl-ethanone oxime-O-(4-methoxyphenyl-sulfonate);
2,2,2-trifluoro-1-phenyl-ethanone oxime-O-(1-naphthyl-sulfonate);
2,2,2-trifluoro-1-phenyl-ethanone oxime-O-(2-naphthyl-sulfonate);
2,2,2-trifluoro-1-phenyl-ethanone oxime-O-(2,4,6-trimethyl-phenylsulfonate);
2,2,2-trifluoro-1-(4-methylphenyl)-ethanone oxime-O-(10-camphorylsulfonate);
2,2,2-trifluoro-1-(4-methylphenyl)-ethanone oxime-O-(methylsulfonate);
2,2,2-trifluoro-1-(2-methylphenyl)-ethanone oxime-O-(10-camphorylsulfonate);
2,2,2-trifluoro-1-(2,4-dimethylphenyl)-ethanone oxime-O-(10-camphorylsulfonate);
2,2,2-trifluoro-1-(2,4-dimethylphenyl)-ethanone oxime-O-(1-naphthylsulfonate);
2,2,2-trifluoro-1-(2,4-dimethylphenyl)-ethanone oxime-O-(2-naphthylsulfonate);
2,2,2-trifluoro-1-(2,4,6-trimethylphenyl)-ethanone oxime-O-(10-camphorylsulfonate);
2,2,2-trifluoro-1-(2,4,6-trimethylphenyl)-ethanone oxime-O-(1-naphthylsulfonate);
2,2,2-trifluoro-1-(2,4,6-trimethylphenyl)-ethanone oxime-O-(2-naphthylsulfonate);
2,2,2-trifluoro-1-(4-methoxyphenyl)-ethanone oxime-O-methylsulfonate;
2,2,2-trifluoro-1-(4-methylthiophenyl)-ethanone oxime-O-methylsulfonate;
2,2,2-trifluoro-1-(3,4-dimethoxyphenyl)-ethanone oxime-O-methylsulfonate;
2,2,3,3,4,4,4-heptafluoro-1-phenyl-butanone oxime-O-(10-camphorylsulfonate);
2,2,2-trifluoro-1-(phenyl)-ethanone oxime-O-methylsulfonate;
2,2,2-trifluoro-1-(phenyl)-ethanone oxime-O-10-camphoryl-sulfonate;
2,2,2-trifluoro-1-(phenyl)-ethanone oxime-O-(4-methoxyphenyl)sulfonate;
2,2,2-trifluoro-1-(phenyl)-ethanone oxime-O-(1-naphthyl)sulfonate;
2,2,2-trifluoro-1-(phenyl)-ethanone oxime-O-(2-naphthyl)sulfonate;
2,2,2-trifluoro-1-(phenyl)-ethanone oxime-O-(2,4,6-trimethylphenyl)sulfonate;
2,2,2-trifluoro-1-(4-methylphenyl)-ethanone oxime-O-(10-camphoryl)sulfonate;
2,2,2-trifluoro-1-(4-methylphenyl)-ethanone oxime-O-methylsulfonate;
2,2,2-trifluoro-1-(2-methylphenyl)-ethanone oxime-O-(10-camphoryl)sulfonate;
2,2,2-trifluoro-1-(2,4-dimethylphenyl)-ethanone oxime-O-(1-naphthyl)sulfonate;
2,2,2-trifluoro-1-(2,4-dimethylphenyl)-ethanone oxime-O-(2-naphthyl)sulfonate;
2,2,2-trifluoro-1-(2,4,6-trimethylphenyl)-ethanone oxime-O-(10-camphoryl)sulfonate;
2,2,2-trifluoro-1-(2,4,6-trimethylphenyl)-ethanone oxime-O-(1-naphthyl)sulfonate;
2,2,2-trifluoro-1-(2,4,6-trimethylphenyl)-ethanone oxime-O-(2-naphthyl)sulfonate;
2,2,2-trifluoro-1-(4-methoxyphenyl)-ethanone oxime-O-methylsulfonate;
2,2,2-trifluoro-1-(4-thiomethylphenyl)-ethanone oxime-O-methylsulfonate;

2,2,2-trifluoro-1-(3,4-dimethoxyphenyl)-ethanone oxime-O-methylsulfonate;
2,2,2-trifluoro-1-(4-methoxyphenyl)-ethanone oxime-O-(4-methylphenyl)sulfonate;
2,2,2-trifluoro-1-(4-methoxyphenyl)-ethanone oxime-O-(4-methoxyphenyl)sulfonate;
2,2,2-trifluoro-1-(4-methoxyphenyl)-ethanone oxime-O-(4-dodecylphenyl)sulfonate;
2,2,2-trifluoro-1-(4-methoxyphenyl)-ethanone oxime-O-octylsulfonate;
2,2,2-trifluoro-1-(4-thiomethylphenyl)-ethanone oxime-O-(4-methoxyphenyl)sulfonate;
2,2,2-trifluoro-1-(4-thiomethylphenyl)-ethanone oxime-O-(4-dodecylphenyl)sulfonate;
2,2,2-trifluoro-1-(4-thiomethylphenyl)-ethanone oxime-O-octylsulfonate;
2,2,2-trifluoro-1-(4-thiomethylphenyl)-ethanone oxime-O-(2-naphthyl)sulfonate;
2,2,2-trifluoro-1-(2-methylphenyl)-ethanone oxime-O-methylsulfonate;
2,2,2-trifluoro-1-(4-methylphenyl)-ethanone oxime-O-phenylsulfonate;
2,2,2-trifluoro-1-(4-chlorophenyl)-ethanone oxime-O-phenylsulfonate;
2,2,3,3,4,4,4-heptafluoro-1-(phenyl)-butanone oxime-O-(10-camphoryl)sulfonate;
2,2,2-trifluoro-1-naphthyl-ethanone oxime-O-methylsulfonate;
2,2,2-trifluoro-2-naphthyl-ethanone oxime-O-methylsulfonate;
2,2,2-trifluoro-1-[4-benzylphenyl]-ethanone oxime-O-methylsulfonate;
2,2,2-trifluoro-1-[4-(phenyl-1,4-dioxa-but-1-yl)phenyl]-ethanone oxime-O-methylsulfonate;
2,2,2-trifluoro-1-naphthyl-ethanone oxime-O-propylsulfonate;
2,2,2-trifluoro-2-naphthyl-ethanone oxime-O-propylsulfonate;
2,2,2-trifluoro-1-[4-benzylphenyl]-ethanone oxime-O-propylsulfonate;
2,2,2-trifluoro-1-[4-methylsulfonylphenyl]-ethanone oxime-O-propylsulfonate;
1,3-bis[1-(4-phenoxyphenyl)-2,2,2-trifluoroethanone oxime-O-sulfonyl]phenyl;
2,2,2-trifluoro-1-[4-methylsulfonyloxyphenyl]-ethanone oxime-O-propylsulfonate;
2,2,2-trifluoro-1-[4-methylcarbonyloxyphenyl]-ethanone oxime-O-propylsulfonate;
2,2,2-trifluoro-1-[6H,7H-5,8-dioxonaphth-2-yl]-ethanone oxime-O-propylsulfonate;
2,2,2-trifluoro-1-[4-methoxycarbonylmethoxyphenyl]-ethanone oxime-O-propylsulfonate;
2,2,2-trifluoro-1-[4-(methoxycarbonyl)-(4-amino-1-oxa-pent-1-yl)-phenyl]-ethanone oxime-O-propylsulfonate;
2,2,2-trifluoro-1-[3,5-dimethyl-4-ethoxyphenyl]-ethanone oxime-O-propylsulfonate;
2,2,2-trifluoro-1-[4-benzyloxyphenyl]-ethanone oxime-O-propylsulfonate;
2,2,2-trifluoro-1-[2-thiophenyl]-ethanone oxime-O-propylsulfonate; and
2,2,2-trifluoro-1-[1-dioxa-thiophen-2-yl)]-ethanone oxime-O-propylsulfonate.

Also included are the oxime sulfonates described in JP-A 9-95479 and JP-A 9-230588 and the references cited therein, for example,
α-(p-toluenesulfonyloxyimino)-phenylacetonitrile,
α-(p-chlorobenzenesulfonyloxyimino)-phenylacetonitrile,
α-(4-nitrobenzenesulfonyloxyimino)-phenylacetonitrile,
α-(4-nitro-2-trifluoromethylbenzenesulfonyloxyimino)-phenylacetonitrile,
α-(benzenesulfonyloxyimino)-4-chlorophenylacetonitrile,
α-(benzenesulfonyloxyimino)-2,4-dichlorophenylacetonitrile,
α-(benzenesulfonyloxyimino)-2,6-dichlorophenylacetonitrile,
α-(benzenesulfonyloxyimino)-4-methoxyphenylacetonitrile,
α-(2-chlorobenzenesulfonyloxyimino)-4-methoxyphenylacetonitrile,
α-(benzenesulfonyloxyimino)-2-thienylacetonitrile,
α-(4-dodecylbenzenesulfonyloxyimino)-phenylacetonitrile,
α-[(4-toluenesulfonyloxyimino)-4-methoxyphenyl]acetonitrile,
α-[(dodecylbenzenesulfonyloxyimino)-4-methoxyphenyl]-acetonitrile,
α-(tosyloxyimino)-3-thienylacetonitrile,
α-(methylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitrile.

Suitable bisoxime sulfonates include those described in JP-A 9-208554, for example,
bis(α-(4-toluenesulfonyloxy)imino)-p-phenylenediacetonitrile,
bis(α-(benzenesulfonyloxy)imino)-p-phenylenediacetonitrile,
bis(α-(methanesulfonyloxy)imino)-p-phenylenediacetonitrile,
bis(α-(butanesulfonyloxy)imino)-p-phenylenediacetonitrile,
bis(α-(10-camphorsulfonyloxy)imino)-p-phenylenediacetonitrile,
bis(α-(4-toluenesulfonyloxy)imino)-p-phenylenediacetonitrile,
bis(α-(trifluoromethanesulfonyloxy)imino)-p-phenylene-diacetonitrile,
bis(α-(4-methoxybenzenesulfonyloxy)imino)-p-phenylene-diacetonitrile,
bis(α-(4-toluenesulfonyloxy)imino)-m-phenylenediacetonitrile,
bis(α-(benzenesulfonyloxy)imino)-m-phenylenediacetonitrile,
bis(α-(methanesulfonyloxy)imino)-m-phenylenediacetonitrile,
bis(α-(butanesulfonyloxy)imino)-m-phenylenediacetonitrile,
bis(α-(10-camphorsulfonyloxy)imino)-m-phenylenediacetonitrile,
bis(α-(4-toluenesulfonyloxy)imino)-m-phenylenediacetonitrile,
bis(α-(trifluoromethanesulfonyloxy)imino)-m-phenylene-diacetonitrile,
bis(α-(4-methoxybenzenesulfonyloxy)imino)-m-phenylene-diacetonitrile, etc.

Of the photoacid generators, sulfonium salts, bissulfonyldiazomethanes, N-sulfonyloxyimides and glyoxime derivatives are preferred, with the sulfonium salts, bissulfonyldiazomethanes, and N-sulfonyloxyimides being most preferred. Illustrative examples include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(4'-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(4'-toluene-sulfonyloxy)benzenesulfonate, tris(4-methylphenyl)sulfonium camphorsulfonate, tris(4-tert-butylphenyl)sulfonium camphorsulfonate, bis(tert-butylsulfonyl)diazomethane, bis(cyclohexylsulfonyl)diazomethane, bis(2,4-dimethylphenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)-diazomethane, bis(4-tert-butylphenylsulfonyl)diazomethane, N-camphorsulfonyloxy-5-norbornene-2,3-dicarboxylic acid imide, and N-p-toluenesulfonyloxy-5-norbornene-2,3-dicarboxylic acid imide.

In the resist composition of the invention, the photoacid generator may be added in any desired amount, typically from more than 0 to 10 parts by weight, preferably from more than 0 to 5 parts by weight, among 100 parts by weight of the solids in the composition. Excessive amounts of the photoacid generator may degrade resolution and give rise to a problem of foreign matter during development and resist peeling. The photoacid generators may be used alone or in admixture. It is also possible to use a photoacid generator having a low transmittance at the exposure wavelength in a controlled amount so as to adjust the transmittance of a resist coating.

In the resist composition of the invention, there may be added a compound which is decomposed with an acid to generate another acid, that is, acid-propagating compound. For these compounds, reference should be made to J. Photopolym. Sci. and Tech., 8, 43-44, 45-46 (1995), and ibid., 9, 29-30 (1996).

Examples of the acid-propagating compound include tert-butyl 2-methyl-2-tosyloxymethylacetoacetate and 2-phenyl 2-(2-tosyloxyethyl)-1,3-dioxolane, but are not limited thereto. Of well-known photoacid generators, many of those compounds having poor stability, especially poor thermal stability exhibit an acid-propagating compound-like behavior.

In the resist composition of the invention, an appropriate amount of the acid-propagating compound is up to 2 parts, and especially up to 1 part by weight among 100 parts by weight of the solids in the composition. Excessive amounts of the acid-propagating compound makes diffusion control difficult, leading to degradation of resolution and pattern configuration.

Organic Solvent

The organic solvent used herein may be any organic solvent in which the base resin, photoacid generator, and other components are soluble. Illustrative, non-limiting, examples of the organic solvent include ketones such as cyclohexanone and methyl 2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, or a mixture thereof because the photoacid generator is most soluble therein.

An appropriate amount of the organic solvent used is about 200 to 1,000 parts, especially about 400 to 800 parts by weight per 100 parts by weight of the base resin.

Other Polymer

To the resist composition of the invention, another polymer different from the inventive polymer may also be added. The other polymers that can be added to the resist composition are, for example, those polymers comprising units of the following formula (R1) and/or (R2) and having a weight average molecular weight of about 1,000 to about 50,000, especially about 3,000 to about 30,000 although the other polymers are not limited thereto.

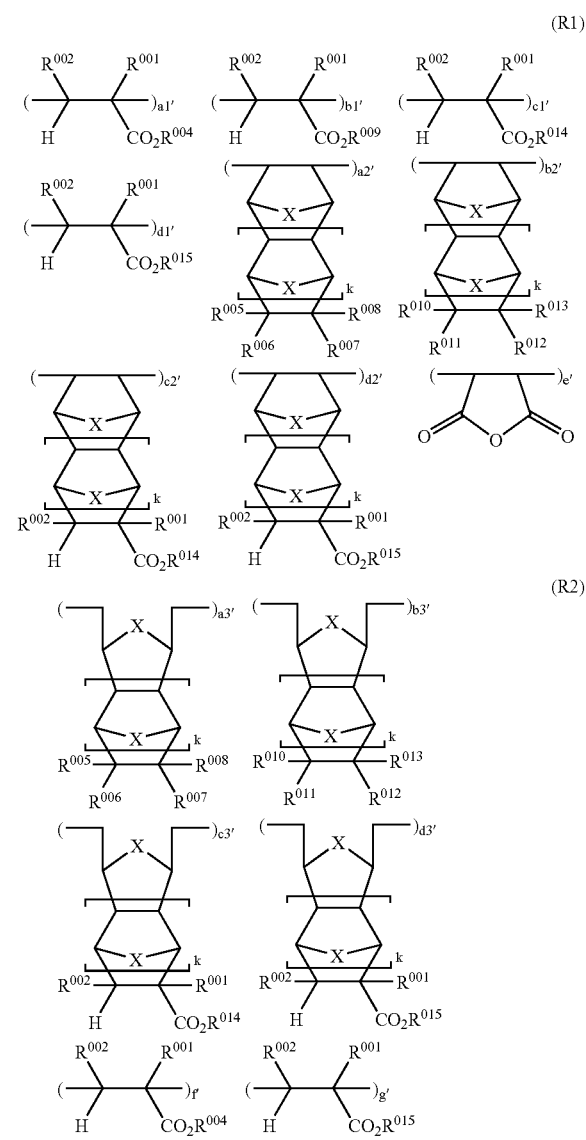

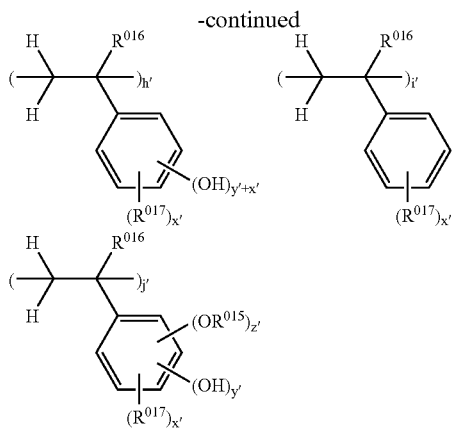

Herein, $R^{001}$ is hydrogen, methyl or $CH_2CO_2R^{003}$. $R^{002}$ is hydrogen, methyl or $CO_2R^{003}$. $R^{003}$ is a straight, branched or cyclic $C_1$-$C_{15}$ alkyl group. $R^{004}$ is hydrogen or a monovalent $C_1$-$C_{15}$ hydrocarbon group having a carboxyl or hydroxyl group. At least one of $R^{005}$ to $R^{008}$ represents a monovalent $C_1$-$C_{15}$ hydrocarbon group having a carboxyl or hydroxyl group while the remaining R's independently represent hydrogen or a straight, branched or cyclic $C_1$-$C_{15}$ alkyl group. Alternatively, $R^{005}$ to $R^{008}$, taken together, may form a ring, and in that event, at least one of $R^{005}$ to $R^{008}$ is a divalent $C_1$-$C_{15}$ hydrocarbon group having a carboxyl or hydroxyl group, while the remaining R's are independently single bonds or straight, branched or cyclic $C_1$-$C_{15}$ alkylene groups. $R^{009}$ is a monovalent $C_2$-$C_{15}$ hydrocarbon group containing a —$CO_2$— partial structure. At least one of $R^{010}$ to $R^{013}$ is a monovalent $C_2$-$C_{15}$ hydrocarbon group containing a —$CO_2$— partial structure, while the remaining R's are independently hydrogen or straight, branched or cyclic $C_1$-$C_{15}$ alkyl groups. $R^{010}$ to $R^{013}$, taken together, may form a ring, and in that event, at least one of $R^{010}$ to $R^{013}$ is a divalent $C_1$-$C_{15}$ hydrocarbon group containing a —$CO_2$— partial structure, while the remaining R's are independently single bonds or straight, branched or cyclic $C_1$-$C_{15}$ alkylene groups. $R^{014}$ is a polycyclic hydrocarbon group of 7 to 15 carbon atoms or an alkyl group containing a polycyclic hydrocarbon group. $R^{015}$ is an acid labile group. $R^{016}$ is hydrogen or methyl. $R^{017}$ is a straight, branched or cyclic $C_1$-$C_8$ alkyl group. X is $CH_2$ or an oxygen atom. Letter k' is equal to 0 or 1; a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1; f', g', h', i', and j' are numbers from 0 to less than 1, satisfying f'+g'+h'+i'+j'=1; x', y' and z' each are an integer of 0 to 3, satisfying $1 \leq x'+y'+z' \leq 5$ and $1 \leq y'+z' \leq 3$.

Exemplary groups of these R's are as exemplified above.

The inventive polymer and the other polymer are preferably blended in a weight ratio from 100:0 to 10:90, more preferably from 100:0 to 20:80. If the blend ratio of the inventive polymer is below this range, the resist composition would become poor in some of the desired properties. The properties of the resist composition can be adjusted by properly changing the blend ratio of the inventive polymer.

The other polymer is not limited to one type and a mixture of two or more other polymers may be added. The use of plural polymers allows for easy adjustment of resist properties.

Dissolution Regulator

To the resist composition, a dissolution regulator may be added. The dissolution regulator is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid-labile groups, both the compounds having an average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

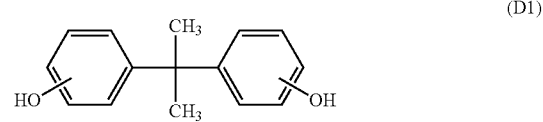

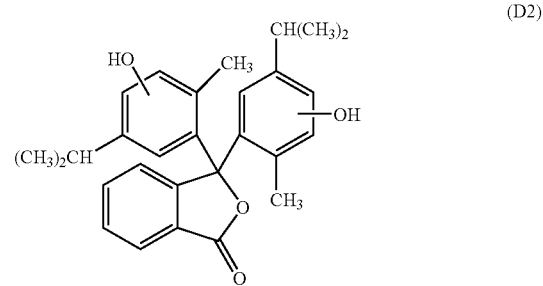

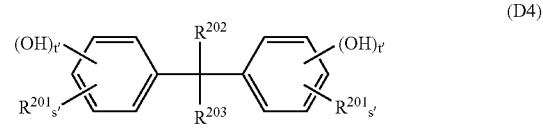

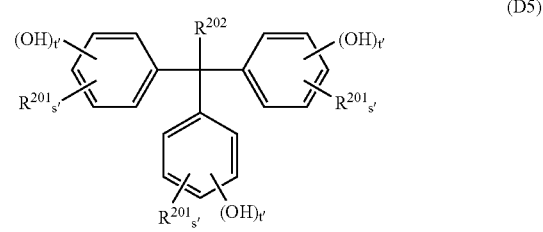

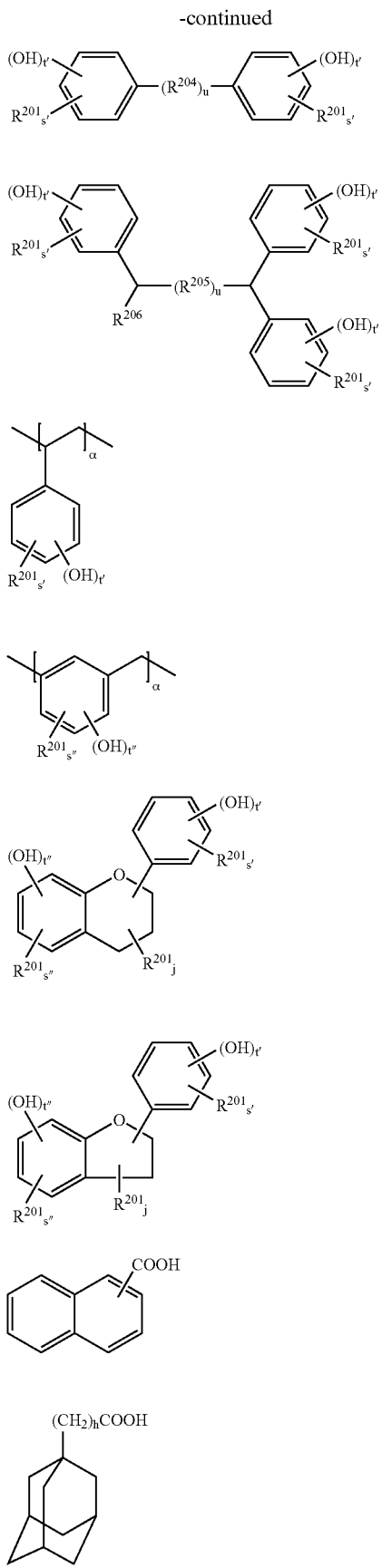

In these formulas, $R^{201}$ and $R^{202}$ are each hydrogen or a straight or branched $C_1$-$C_8$ alkyl or alkenyl; $R^{203}$ is hydrogen, a straight or branched $C_1$-$C_8$ alkyl or alkenyl, or —$(R^{207})_h$—COOH; $R^{204}$ is —$(CH_2)_i$— (where i=2 to 10), a $C_6$-$C_{10}$ arylene, carbonyl, sulfonyl, an oxygen atom, or a sulfur atom; $R^{205}$ is a $C_1$-$C_{10}$ alkylene, a $C_6$-$C_{10}$ arylene, carbonyl, sulfonyl, an oxygen atom, or a sulfur atom; $R^{206}$ is hydrogen, a straight or branched $C_1$-$C_8$ alkyl or alkenyl, or a hydroxyl-substituted phenyl or naphthyl; $R^{207}$ is a straight or branched $C_1$-$C_{10}$ alkylene; $R^{208}$ is hydrogen or hydroxyl; the letter j is an integer from 0 to 5; u and h are each 0 or 1; s, t, s', t', s", and t" are each numbers which satisfy s+t=8, s'+t'=5, and s"+t"=4, and are such that each phenyl structure has at least one hydroxyl group; and α is a number such that the compounds of formula (D8) or (D9) have a molecular weight of from 100 to 1,000.

In the above formulas, suitable examples of $R^{201}$ and $R^{202}$ include hydrogen, methyl, ethyl, butyl, propyl, ethynyl, and cyclohexyl; suitable examples of $R^{203}$ include the same groups as for $R^{201}$ and $R^{202}$, as well as —COOH and —$CH_2$COOH; suitable examples of $R^{204}$ include ethylene, phenylene, carbonyl, sulfonyl, oxygen, and sulfur; suitable examples of $R^{205}$ include methylene as well as the same groups as for $R^{204}$; and suitable examples of $R^{206}$ include hydrogen, methyl, ethyl, butyl, propyl, ethynyl, cyclohexyl, and hydroxyl-substituted phenyl or naphthyl.

Exemplary acid labile groups on the dissolution regulator include groups of the following general formulae (L1) to (L4), tertiary alkyl groups of 4 to 20 carbon atoms, trialkylsilyl groups in which each of the alkyls has 1 to 6 carbon atoms, and oxoalkyl groups of 4 to 20 carbon atoms.

-continued

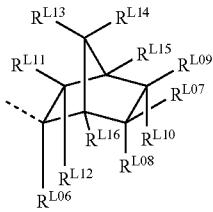

(L4)

In these formulas, a broken line denotes a bond position and bond direction. $R^{L01}$ and $R^{L02}$ are each hydrogen or a straight, branched or cyclic $C_1$-$C_{18}$ alkyl; and $R^{L03}$ is a monovalent $C_1$-$C_{18}$ hydrocarbon group which may contain a heteroatom (e.g., oxygen). A pair of $R^{L01}$ and $R^{L02}$, a pair of $R^{L01}$ and $R^{L03}$, or a pair of $R^{L02}$ and $R^{L03}$ may together form a ring, with the proviso that $R^{L01}$, $R^{L02}$, and $R^{L03}$ are each a straight or branched $C_1$-$C_{18}$ alkylene when they form a ring. $R^{L04}$ is a tertiary alkyl group of 4 to 20 carbon atoms, a trialkysilyl group in which each of the alkyls has 1 to 6 carbon atoms, an oxoalkyl group of 4 to 20 carbon atoms, or a group of the formula (L1). $R^{L05}$ is a monovalent $C_1$-$C_8$ hydrocarbon group which may contain a hetero atom or a substituted or unsubstituted $C_6$-$C_{20}$ aryl group. $R^{L06}$ is a monovalent $C_1$-$C_8$ hydrocarbon group which may contain a hetero atom or a substituted or unsubstituted $C_6$-$C_{20}$ aryl group. $R^{L07}$ to $R^{L16}$ independently represent hydrogen or monovalent $C_1$-$C_{15}$ hydrocarbon groups which may contain a hetero atom. Alternatively, $R^{L07}$ to $R^{L16}$, taken together, may form a ring. Each of $R^{L07}$ to $R^{L16}$ represents a divalent $C_1$-$C_{15}$ hydrocarbon group which may contain a hetero atom, when they form a ring. Two of $R^{L07}$ to $R^{L10}$ which are attached to adjoining carbon atoms may bond together directly to form a double bond. Letter y is an integer of 0 to 6. Letter m is equal to 0 or 1, n is equal to 0, 1, 2 or 3, and 2m+n is equal to 2 or 3. Illustrative examples of these groups are as previously exemplified.

The dissolution regulator may be formulated in an amount of 0 to 50 parts, preferably 0 to 40 parts, and more preferably 0 to 30 parts by weight, per 100 parts by weight of the base resin, and may be used singly or as a mixture of two or more thereof. The use of more than 50 parts would lead to slimming of the patterned film, and thus a decline in resolution.

The dissolution regulator can be synthesized by introducing acid labile groups into a compound having phenolic hydroxyl or carboxyl groups in accordance with an organic chemical formulation.

Nitrogen-Containing Compound

In the resist composition of the invention, one or more organic nitrogen-containing compounds may be formulated. The organic nitrogen-containing compound is preferably a compound capable of suppressing the rate of diffusion when the acid generated by the photoacid generator diffuses within the resist film. The inclusion of this type of organic nitrogen-containing compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of organic nitrogen-containing compounds include primary, secondary, and tertiary aliphatic amines, mixed amines, aromatic amines, heterocyclic amines, carboxyl group-containing nitrogen compounds, sulfonyl group-containing nitrogen compounds, hydroxyl group-containing nitrogen compounds, hydroxyphenyl group-containing nitrogen compounds, alcoholic nitrogen-containing compounds, amide derivatives, imide derivatives, and carbamate derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-containing nitrogen compounds include aminobenzoic acid, indolecarboxylic acid, and amino acid derivatives (e.g. nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-containing nitrogen compounds include 3-pyridinesulfonic acid and pyridinium p-toluenesulfonate. Examples of suitable hydroxyl group-containing nitrogen compounds, hydroxyphenyl group-containing nitrogen compounds, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl) morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-t-butoxycarbonyl-N,N-dicyclohexylamine, N-t-butoxycarbonylbenzimidazole and oxazolidinone.

In addition, organic nitrogen-containing compounds of the following general formula (B)-1 may also be included alone or in admixture.

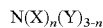    (B)-1

In the formula, n is equal to 1, 2 or 3; side chain Y is independently hydrogen or a straight, branched or cyclic alkyl group of 1 to 20 carbon atoms which may contain an ether or hydroxyl group; and side chain X is independently selected from groups of the following general formulas (X)-1 to (X)-3, and two or three X's may bond together to form a ring.

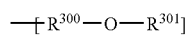 (X)-1

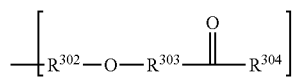 (X)-2

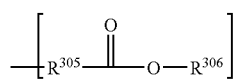 (X)-3

In the formulas, $R^{300}$, $R^{302}$ and $R^{305}$ are independently straight or branched $C_1$-$C_4$ alkylene groups; $R^{301}$ and $R^{304}$ are independently hydrogen, straight, branched or cyclic $C_1$-$C_{20}$ alkyl groups, which may contain at least one hydroxyl, ether, ester group or lactone ring; $R^{303}$ is a single bond or a straight or branched $C_1$-$C_4$ alkylene group; and $R^{306}$ is hydrogen or a straight, branched or cyclic $C_1$-$C_{20}$ alkyl group, which may contain at least one hydroxyl, ether, ester group or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more of organic nitrogen-containing compounds having a cyclic structure represented by the following general formula (B)-2.

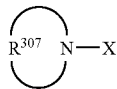 (B)-2

Herein X is as defined above, and $R^{307}$ is a straight or branched $C_2$-$C_{20}$ alkylene group which may contain one or more carbonyl, ether, ester or sulfide groups.

Illustrative examples of the organic nitrogen-containing compounds having a cyclic structure represented by formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of organic cyano group-containing nitrogen compounds represented by the following general formulae (B)-3 to (B)-6 may be blended.

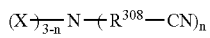 (B)-3

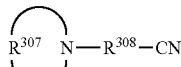 (B)-4

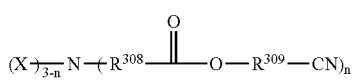 (B)-5

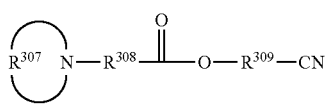 (B)-6

Herein, X, $R^{307}$ and n are as defined above, and $R^{309}$ and $R^{309}$ are each independently a straight or branched alkylene group of 1 to 4 carbon atoms.

Illustrative examples of the organic cyano group-containing nitrogen compounds represented by formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiono-nitrile, N-(2-cyanoethyl)-N-(3-hydroxy-1-propyl)-3-aminopropionitrile, N-(3-acetoxy-1-propyl)-N-(2-cyanoethyl)-3-aminopropiono-nitrile, N-(2-cyanoethyl)-N-(3-formyloxy-1-propyl)-3-aminopropiono-nitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are organic nitrogen-containing compounds having an imidazole structure and a polar functional group, represented by the general formula (B)-7.

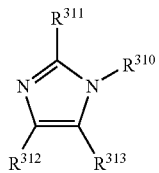

(B)-7

Herein, $R^{310}$ is a straight, branched or cyclic $C_2$-$C_{20}$ alkyl group having at least one polar functional group selected from among hydroxyl, carbonyl, ester, ether, sulfide, carbonate, cyano and acetal groups; $R^{311}$, $R^{312}$ and $R^{313}$ are each independently a hydrogen atom, a straight, branched or cyclic alkyl group, aryl group or aralkyl group having 1 to 10 carbon atoms.

Also included are organic nitrogen-containing compounds having a benzimidazole structure and a polar functional group, represented by the general formula (B)-8.

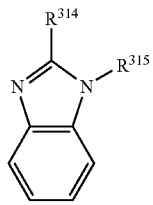

(B)-8

Herein, $R^{314}$ is a hydrogen atom, a straight, branched or cyclic alkyl group, aryl group or aralkyl group having 1 to 10 carbon atoms. $R^{315}$ is a polar functional group-bearing, straight, branched or cyclic $C_1$-$C_{20}$ alkyl group, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

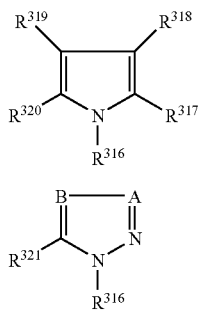

(B)-9

(B)-10

Herein, A is a nitrogen atom or $=$C—$R^{322}$, B is a nitrogen atom or $=$C—$R^{323}$, $R^{316}$ is a straight, branched or cyclic $C_2$-$C_{20}$ alkyl group having at least one polar functional group selected from among hydroxyl, carbonyl, ester, ether, sulfide, carbonate, cyano and acetal groups; $R^{317}$, $R^{318}$, $R^{319}$ and $R^{320}$ are each independently a hydrogen atom, a straight, branched or cyclic alkyl group or aryl group having 1 to 10 carbon atoms, or a pair of $R^{317}$ and $R^{318}$ and a pair of $R^{319}$ and $R^{320}$, taken together, may form a benzene, naphthalene or pyridine ring; $R^{321}$ is a hydrogen atom, a straight, branched or cyclic alkyl group or aryl group having 1 to 10 carbon atoms; $R^{322}$ and $R^{323}$ each are a hydrogen atom, a straight, branched or cyclic alkyl group or aryl group having 1 to 10 carbon atoms, or a pair of $R^{321}$, and $R^{323}$, taken together, may form a benzene or naphthalene ring.

The organic nitrogen-containing compounds may be used alone or in admixture of two or more. The organic nitrogen-containing compound is preferably formulated in an amount of 0.001 to 2 parts, and especially 0.01 to 1 part by weight, per 100 parts by weight of the entire base resin. Less than 0.001 part of the organic nitrogen-containing compound achieves no or little addition effect whereas more than 2 parts would result in too low a sensitivity.

Other Components

In the resist composition, a compound having a carboxyl group may be blended. Exemplary, non-limiting compounds having a carboxyl group include one or more compounds selected from Groups I and II below. Including this compound improves the PED stability of the resist and ameliorates edge roughness on nitride film substrates.

Group I:

Compounds in which some or all of the hydrogen atoms on the phenolic hydroxyl groups of the compounds of general formulas (A1) to (A10) below have been replaced with —$R^{401}$—COOH (wherein $R^{401}$ is a straight or branched alkylene of 1 to 10 carbon atoms), and in which the molar ratio C/(C+D) of phenolic hydroxyl groups (C) to $=$C—COOH groups (D) in the molecule is from 0.1 to 1.0.

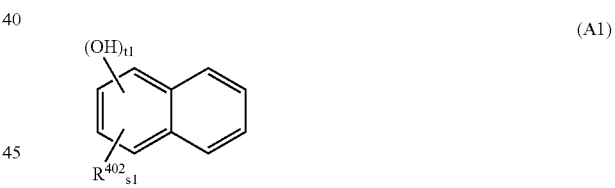

(A1)

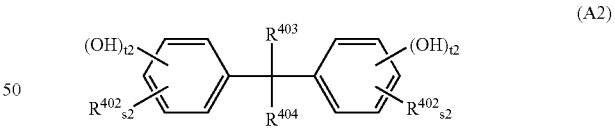

(A2)

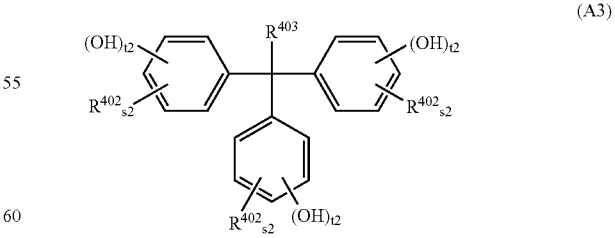

(A3)

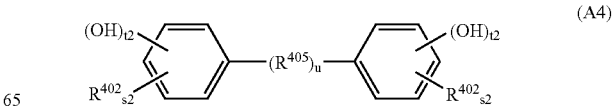

(A4)

-continued

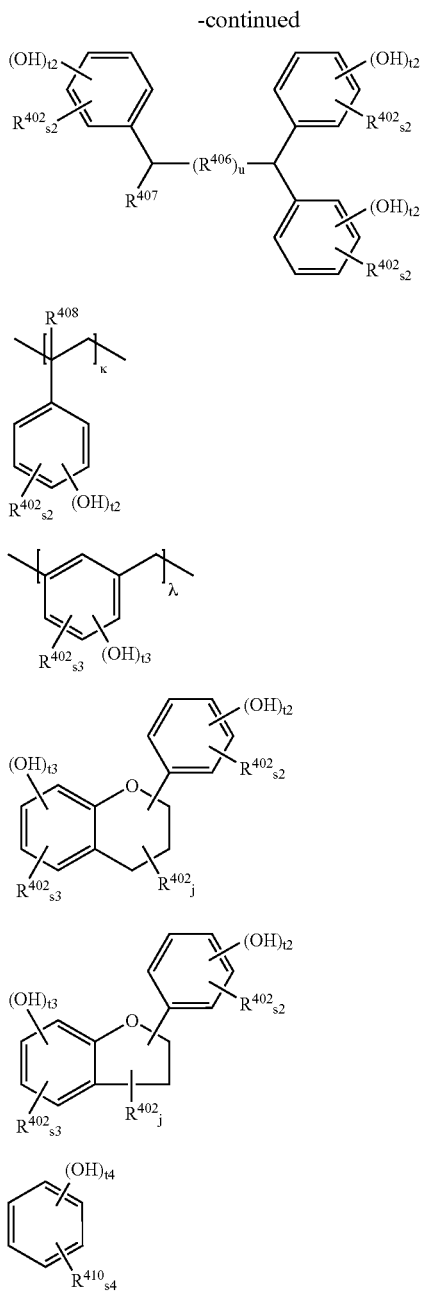

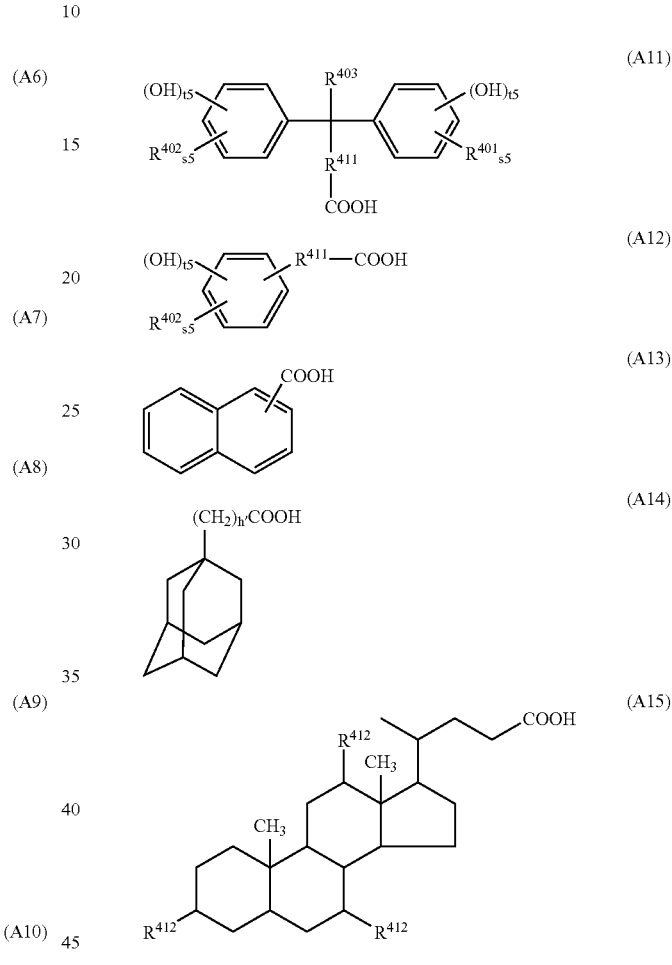

In these formulas, $R^{408}$ is hydrogen or methyl; $R^{402}$ and $R^{403}$ are each hydrogen or a straight or branched $C_1$-$C_8$ alkyl or alkenyl; $R^{404}$ is hydrogen, a straight or branched $C_1$-$C_8$ alkyl or alkenyl, or a —$(R^{409})_h$—COOR' group (R' being hydrogen or —$R^{409}$—COOH); $R^{405}$ is —$(CH_2)_i$— (wherein i is 2 to 10), a $C_6$-$C_{10}$ arylene, carbonyl, sulfonyl, an oxygen atom, or a sulfur atom; $R^{406}$ is a $C_1$-$C_{10}$ alkylene, a $C_6$-$C_{10}$ arylene, carbonyl, sulfonyl, an oxygen atom, or a sulfur atom; $R^{407}$ is hydrogen, a straight or branched $C_1$-$C_8$ alkyl or alkenyl, or a hydroxyl-substituted phenyl or naphthyl; $R^{409}$ is a straight or branched $C_1$-$C_{10}$ alkylene; $R^{410}$ is hydrogen, a straight or branched $C_1$-$C_8$ alkyl or alkenyl, or a —$R^{411}$—COOH group; $R^{411}$ is a straight or branched $C_1$-$C_{10}$ alkylene; the letter j is an integer from 0 to 2; u and h are each 0 or 1; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas (A11) to (A15) below.

In these formulas, $R^{402}$, $R^{403}$, and $R^{411}$ are as defined above; $R^{412}$ is hydrogen or hydroxyl; s5 and t5 are numbers which satisfy s5≧0, t5≧0, and s5+t5=5; and h' is 0 to 2.

Illustrative, non-limiting examples of the compound having a carboxyl group include compounds of the general formulas AI-1 to AI-14 and AII-1 to AII-10 below.

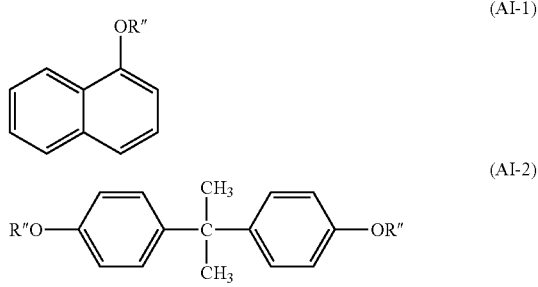

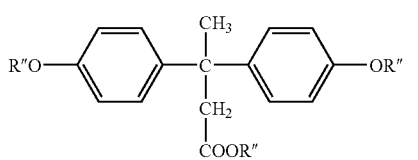 (AI-3)
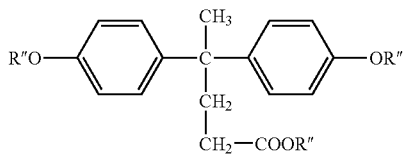 (AI-4)
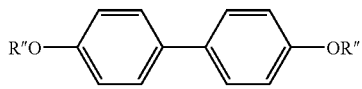 (AI-5)
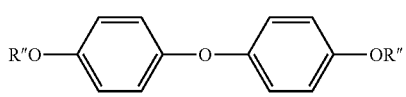 (AI-6)
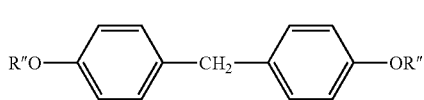 (AI-7)
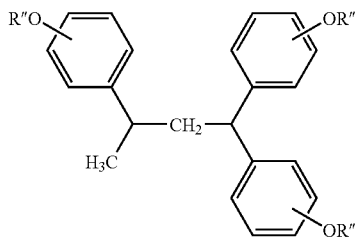 (AI-8)
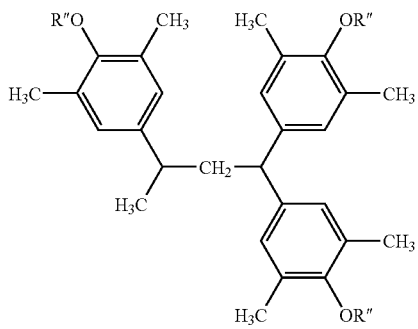 (AI-9)
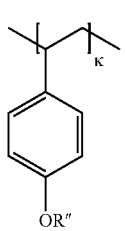 (AI-10)
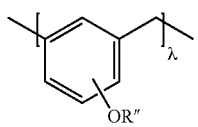 (AI-11)
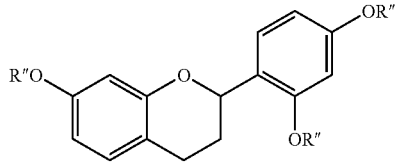 (AI-12)
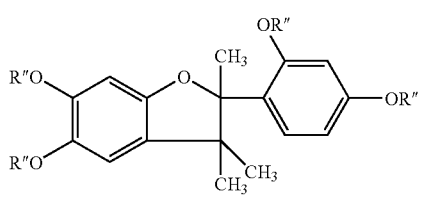 (AI-13)
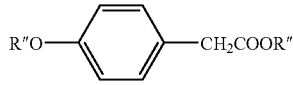 (AI-14)
In the above formulas, R″ is hydrogen or a —CH$_2$COOH group such that the —CH$_2$COOH group accounts for 10 to 100 mol % of R″ in each compound, κ and λ are as defined above.
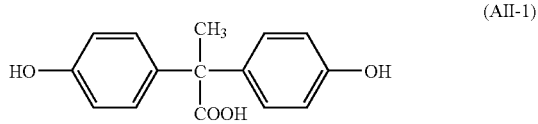 (AII-1)
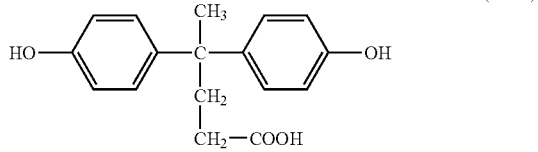 (AII-2)
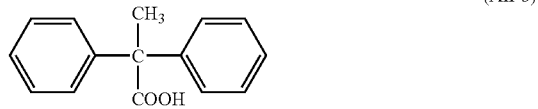 (AII-3)
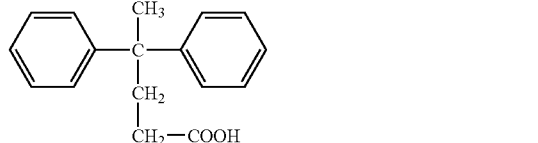 (AII-4)
 (AII-5)
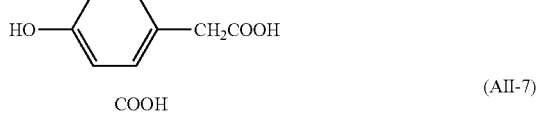 (AII-6)
 (AII-7)

-continued

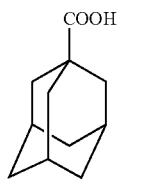
(AII-8)

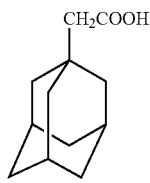
(AII-9)

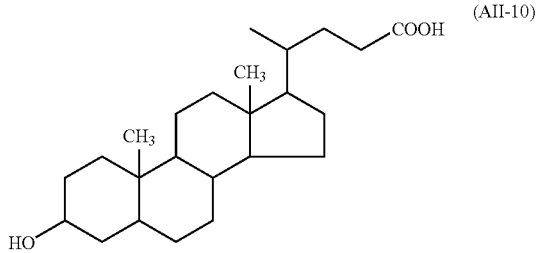
(AII-10)

The compound having a carboxyl group may be used singly or as combinations of two or more thereof.

The compound having a carboxyl group is added in an amount ranging from 0 to 5 parts, preferably 0.1 to 5 parts, more preferably 0.1 to 3 parts, further preferably 0.1 to 2 parts by weight, per 100 parts by weight of the base resin. More than 5 parts of the compound can reduce the resolution of the resist composition.

The resist composition of the invention may additionally include an acetylene alcohol derivative for the purpose of enhancing the shelf stability. Preferred acetylene alcohol derivatives are those having the general formula (S1) or (S2) below.

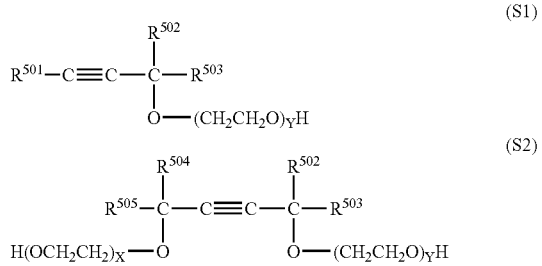

In the formulas, $R^{501}$, $R^{502}$, $R^{503}$, $R^{504}$, and $R^{505}$ are each hydrogen or a straight, branched or cyclic $C_1$-$C_8$ alkyl; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K.

The acetylene alcohol derivative is preferably added in an amount of 0.01 to 2% by weight, and more preferably 0.02 to 1% by weight, per 100% by weight of the resist composition. Less than 0.01% by weight would be ineffective for improving coating characteristics and shelf stability, whereas more than 2% by weight would result in a resist having a low resolution.

The resist composition of the invention may include optional ingredients, for example, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430 and FC-431 from Sumitomo 3M, Ltd., Surflon S-141, S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dai-Nippon Ink & Chemicals, Inc., and X-70-092 and X-70-093 from Shin-Etsu Chemical Co., Ltd. Preferred surfactants are Fluorad FC-430 from Sumitomo 3M, Ltd., KH-20 and KH-30 from Asahi Glass Co., Ltd., and X-70-093 from Shin-Etsu Chemical Co., Ltd.

Pattern formation using the resist composition of the invention may be carried out by a known lithographic technique. For example, the resist composition is applied onto a substrate such as a silicon wafer by spin coating or the like to form a resist film having a thickness of 0.1 to 2.0 μm, which is then pre-baked on a hot plate at 60 to 150° C. for 1 to 10 minutes, and preferably at 80 to 130° C. for 1 to 5 minutes. A patterning mask having the desired pattern is then placed over the resist film, and the film exposed through the mask to an electron beam or to high-energy radiation such as deep-UV rays, an excimer laser, or x-rays in a dose of about 1 to 200 mJ/cm², and preferably about 5 to 100 mJ/cm². Light exposure may be done by a conventional exposure process or in some cases, by an immersion process of providing liquid impregnation between the mask and the resist. The resist film is then post-exposure baked (PEB) on a hot plate at 60 to 150° C. for 1 to 5 minutes, and preferably at 80 to 140° C. for 1 to 3 minutes. Finally, development is carried out using as the developer an aqueous alkali solution, such as a 0.1 to 5 wt % (preferably 2 to 3 wt %) aqueous solution of tetramethylammonium hydroxide (TMAH), this being done by a conventional method such as dip, puddle, or spray development for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with, in particular, deep-UV rays having a wavelength of 248 to 193 nm, an excimer laser, x-rays, or an electron beam. The desired pattern may not be obtainable outside the upper and lower limits of the above range.

EXAMPLE

Synthesis Examples and Examples are given below by way of illustration and not by way of limitation. The abbreviation Mw is a weight average molecular weight as measured by GPC using polystyrene standards, and SEM is scanning electron microscope.

Polymers within the scope of the invention were synthesized by the following procedure.

Synthesis Example 1

Synthesis of Polymer 1

A mixture of 82.9 g of 2-methyl-2-adamantyl methacrylate, 10.2 g of methacrylic acid, 60.8 g of 3-hydroxy-1-adamantyl methacrylate, 96.2 g of 9-methoxycarbonyl-4-oxa-5-oxotricyclo[4.2.1.0$^{3,7}$]nonan-2-yl methacrylate, 0.84 g of 2-mercaptoethanol and 750 g of tetrahydrofuran was heated at 60° C. To the solution was added 5.28 g of 2,2'-azobisisobutyronitrile. The solution was stirred for 20 hours while keeping at 60° C. The reaction solution was cooled to room temperature, after which with vigorous stirring, it was added dropwise to 10 liters of hexane. The resulting solids were collected by filtration and dried in vacuum at 40° C. for 15 hours, obtaining a polymer (designated Polymer 1) in white powder solid form. The amount was 223.0 g and the yield was 89.2%. An integration ratio computed from a $^1$H-NMR spectrum indicated an approximate copolymer compositional ratio of 30/10/25/35. Polymer 1 had a Mw of 6,600.

Synthesis Examples 2-164

Synthesis of Polymers 2-164

Polymers 2 to 164 as shown in Tables 1 to 4 were synthesized by the same procedure as above or a well-known procedure. In Tables 1 to 4, the recurring units included in the copolymers are represented by the following abbreviations. That is, the recurring units of formula (1) are designated as (1A) to (1P), the recurring units of formula (2) are designated as (2A) and (2B), the recurring units of formula (3) are designated as (3A) to (3F), and the recurring units of formula (4) are designated as (4A) to (4P).

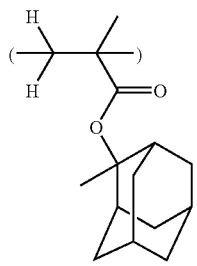

(1A)

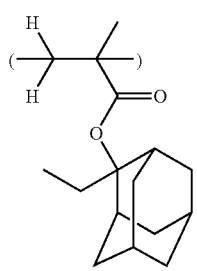

(1B)

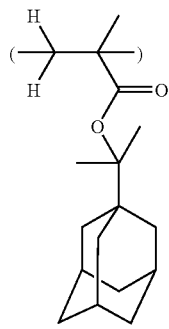

(1C)

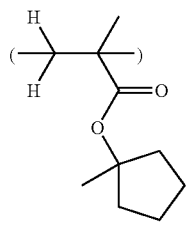

(1D)

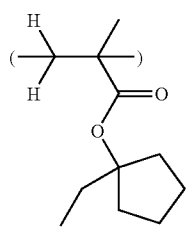

(1E)

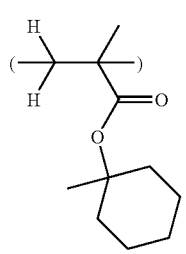

(1F)

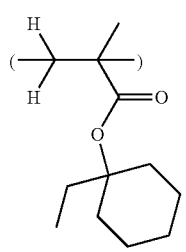

(1G)

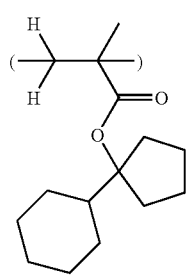

(1H)

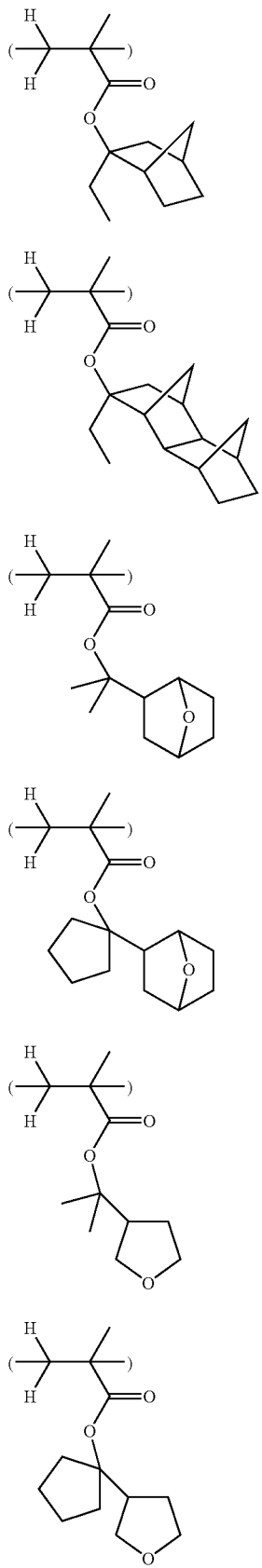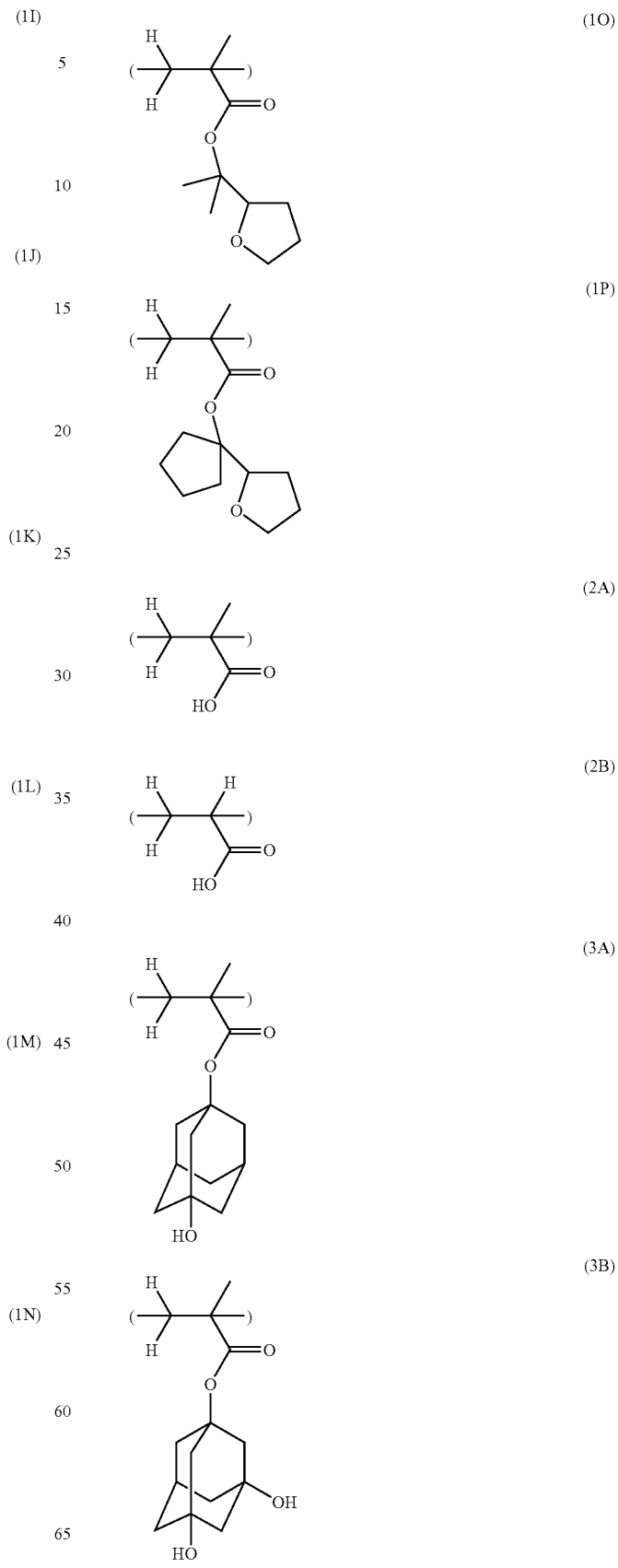

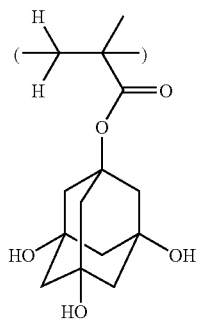
(3C)
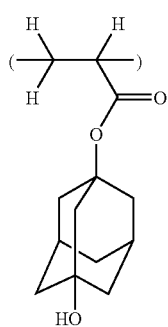
(3D)
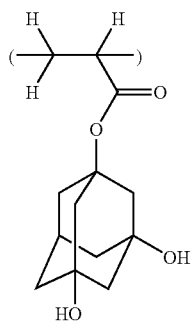
(3E)
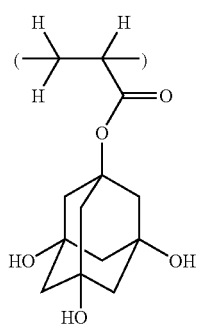
(3F)
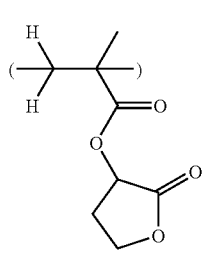
(4A)
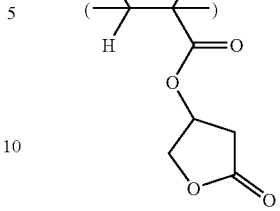
(4B)
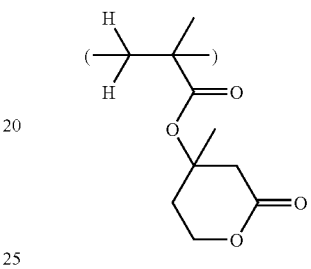
(4C)
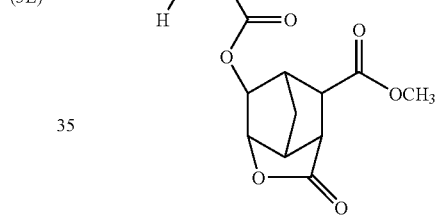
(4D)
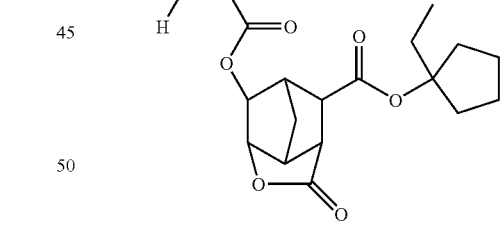
(4E)
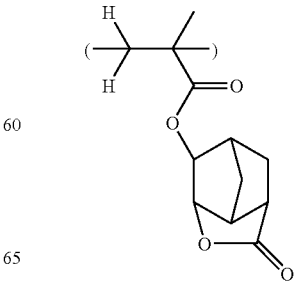
(4F)

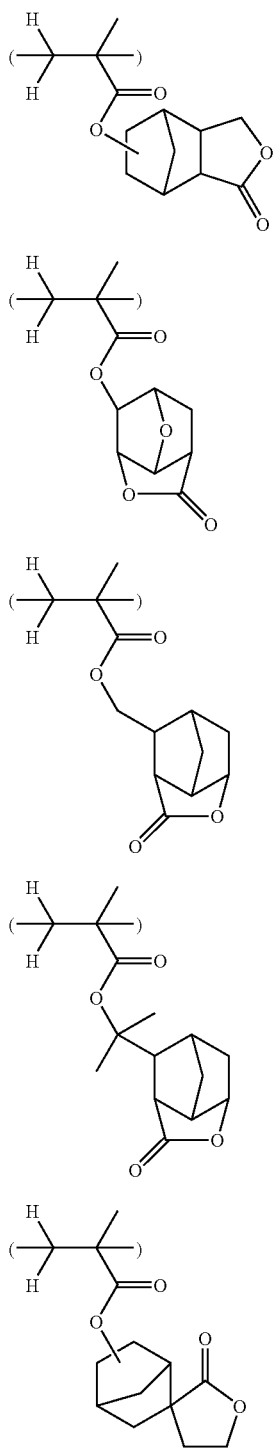
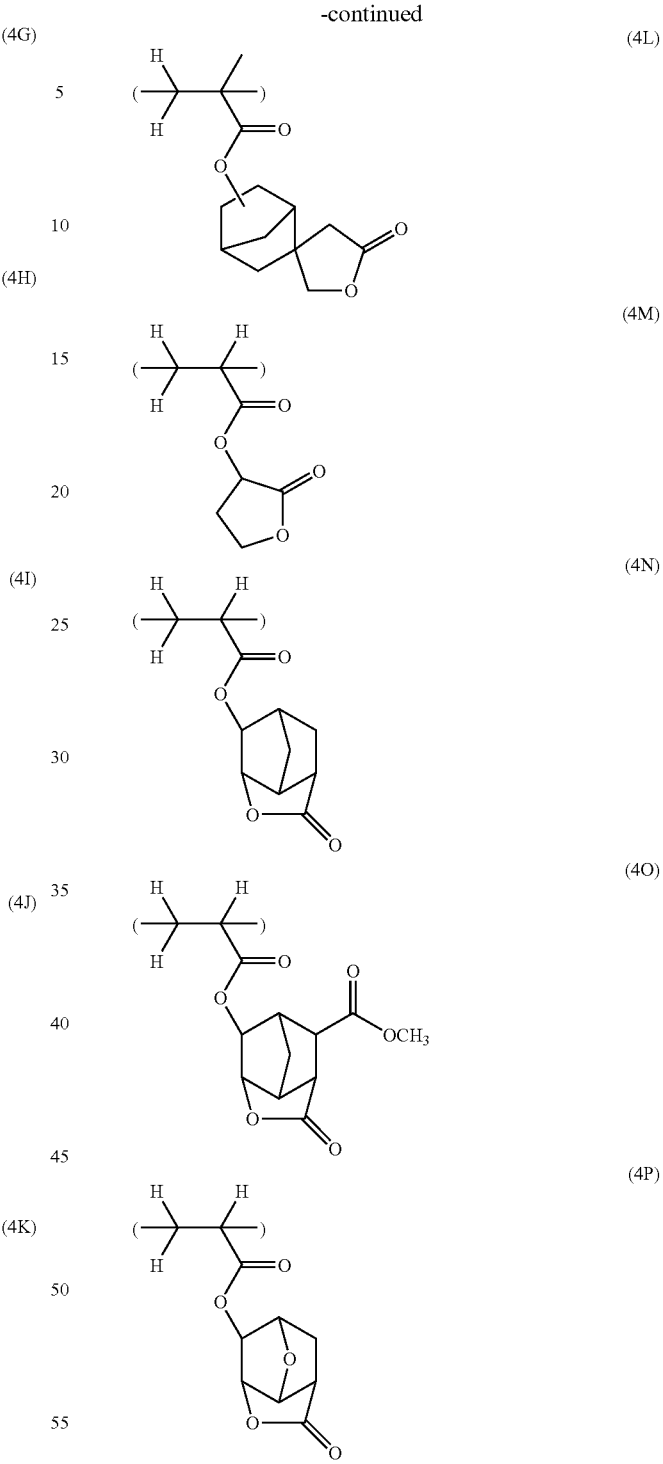
TABLE 1
| Polymer No. | Recurring unit (1) | Recurring unit (2) | Recurring unit (3) | Recurring unit (4) | Compositional ratio | Mw |
|---|---|---|---|---|---|---|
| Polymer 1 | 1A | 2A | 3A | 4D | 30/10/25/35 | 6600 |
| Polymer 2 | 1A | 2A | 3A | 4H | 30/10/25/35 | 6500 |

TABLE 1-continued

| Polymer No. | Recurring unit (1) | Recurring unit (2) | Recurring unit (3) | Recurring unit (4) | Compositional ratio | Mw |
|---|---|---|---|---|---|---|
| Polymer 3 | 1A | 2A | 3A | 4H | 50/10/20/20 | 6700 |
| Polymer 4 | 1B | 2A | 3A | 4D | 30/10/25/35 | 5600 |
| Polymer 5 | 1B | 2A | 3A | 4H | 30/10/25/35 | 5400 |
| Polymer 6 | 1B | 2A | 3A | 4H | 50/10/20/20 | 5000 |
| Polymer 7 | 1C | 2A | 3A | 4D | 30/10/25/35 | 7600 |
| Polymer 8 | 1C | 2A | 3A | 4H | 30/10/25/35 | 7500 |
| Polymer 9 | 1C | 2A | 3A | 4H | 50/10/20/20 | 7800 |
| Polymer 10 | 1D | 2A | 3A | 4H | 30/10/25/35 | 7000 |
| Polymer 11 | 1E | 2A | 3A | 4D | 30/10/25/35 | 6500 |
| Polymer 12 | 1E | 2A | 3A | 4H | 30/10/25/35 | 6400 |
| Polymer 13 | 1E | 2A | 3A | 4H | 50/10/20/20 | 6700 |
| Polymer 14 | 1F | 2A | 3A | 4H | 30/10/25/35 | 7300 |
| Polymer 15 | 1G | 2A | 3A | 4H | 30/10/25/35 | 6500 |
| Polymer 16 | 1H | 2A | 3A | 4D | 25/10/25/40 | 6900 |
| Polymer 17 | 1H | 2A | 3A | 4H | 25/10/25/40 | 7100 |
| Polymer 18 | 1H | 2A | 3A | 4H | 50/10/20/20 | 7300 |
| Polymer 19 | 1I | 2A | 3A | 4A | 25/10/25/40 | 6600 |
| Polymer 20 | 1I | 2A | 3A | 4D | 25/10/25/40 | 6800 |
| Polymer 21 | 1I | 2A | 3A | 4F | 25/10/25/40 | 6500 |
| Polymer 22 | 1I | 2A | 3A | 4H | 25/10/25/40 | 6900 |
| Polymer 23 | 1I | 2A | 3A | 4H | 50/10/20/20 | 6500 |
| Polymer 24 | 1J | 2A | 3A | 4A | 25/10/25/40 | 6200 |
| Polymer 25 | 1J | 2A | 3A | 4A | 50/10/20/20 | 6100 |
| Polymer 26 | 1J | 2A | 3A | 4B | 25/10/25/40 | 6300 |
| Polymer 27 | 1J | 2A | 3A | 4C | 25/10/25/40 | 6200 |
| Polymer 28 | 1J | 2A | 3A | 4D | 20/10/25/45 | 6500 |
| Polymer 29 | 1J | 2A | 3A | 4D | 25/10/25/40 | 5700 |
| Polymer 30 | 1J | 2A | 3A | 4D | 50/10/20/20 | 6700 |
| Polymer 31 | 1J | 2A | 3A | 4E | 25/10/25/40 | 6600 |
| Polymer 32 | 1J | 2A | 3A | 4F | 25/10/25/40 | 6500 |
| Polymer 33 | 1J | 2A | 3A | 4F | 50/10/20/20 | 6600 |
| Polymer 34 | 1J | 2A | 3A | 4G | 25/10/25/40 | 6500 |
| Polymer 35 | 1J | 2A | 3A | 4H | 20/10/25/45 | 6900 |
| Polymer 36 | 1J | 2A | 3A | 4H | 25/10/25/40 | 5800 |
| Polymer 37 | 1J | 2A | 3A | 4H | 50/10/20/20 | 6800 |
| Polymer 38 | 1J | 2A | 3A | 4I | 30/10/25/35 | 7200 |
| Polymer 39 | 1J | 2A | 3A | 4J | 30/10/25/35 | 7100 |
| Polymer 40 | 1K | 2A | 3A | 4H | 30/10/25/35 | 6600 |
| Polymer 41 | 1L | 2A | 3A | 4A | 30/10/25/35 | 6500 |
| Polymer 42 | 1L | 2A | 3A | 4D | 30/10/25/35 | 6800 |
| Polymer 43 | 1L | 2A | 3A | 4D | 50/10/20/20 | 7000 |
| Polymer 44 | 1L | 2A | 3A | 4F | 30/10/25/35 | 6400 |
| Polymer 45 | 1L | 2A | 3A | 4H | 25/10/25/40 | 6700 |
| Polymer 46 | 1L | 2A | 3A | 4H | 30/10/25/35 | 6500 |
| Polymer 47 | 1L | 2A | 3A | 4H | 50/10/20/20 | 6700 |
| Polymer 48 | 1M | 2A | 3A | 4H | 30/10/25/35 | 6300 |
| Polymer 49 | 1N | 2A | 3A | 4H | 30/10/25/35 | 6400 |
| Polymer 50 | 1O | 2A | 3A | 4H | 30/10/25/35 | 6200 |
| Polymer 51 | 1P | 2A | 3A | 4H | 30/10/25/35 | 6300 |

TABLE 2

| Polymer No. | Recurring unit (1) | Recurring unit (2) | Recurring unit (3) | Recurring unit (4) | Compositional ratio | Mw |
|---|---|---|---|---|---|---|
| Polymer 52 | 1A | 2A | 3D | 4H | 50/10/20/20 | 9400 |
| Polymer 53 | 1B | 2A | 3D | 4H | 50/10/20/20 | 8500 |
| Polymer 54 | 1C | 2A | 3D | 4H | 50/10/20/20 | 11000 |
| Polymer 55 | 1E | 2A | 3D | 4D | 50/10/20/20 | 9800 |
| Polymer 56 | 1E | 2A | 3D | 4H | 30/10/25/35 | 7900 |
| Polymer 57 | 1E | 2A | 3D | 4H | 50/10/20/20 | 9900 |
| Polymer 58 | 1H | 2A | 3D | 4H | 50/10/20/20 | 9600 |
| Polymer 59 | 1I | 2A | 3D | 4A | 50/10/20/20 | 10600 |
| Polymer 60 | 1I | 2A | 3D | 4D | 50/10/20/20 | 10500 |
| Polymer 61 | 1I | 2A | 3D | 4F | 50/10/20/20 | 11000 |
| Polymer 62 | 1I | 2A | 3D | 4H | 30/10/25/35 | 8600 |
| Polymer 63 | 1I | 2A | 3D | 4H | 40/20/20/20 | 11100 |
| Polymer 64 | 1I | 2A | 3D | 4H | 50/10/20/20 | 10400 |
| Polymer 65 | 1J | 2A | 3D | 4A | 50/10/20/20 | 10000 |
| Polymer 66 | 1J | 2A | 3D | 4D | 50/10/20/20 | 10600 |
| Polymer 67 | 1J | 2A | 3D | 4F | 50/10/20/20 | 10800 |
| Polymer 68 | 1J | 2A | 3D | 4H | 30/10/25/35 | 8200 |
| Polymer 69 | 1J | 2A | 3D | 4H | 50/10/20/20 | 10300 |

TABLE 2-continued

| Polymer No. | Recurring unit (1) | Recurring unit (2) | Recurring unit (3) | Recurring unit (4) | Compositional ratio | Mw |
|---|---|---|---|---|---|---|
| Polymer 70 | 1L | 2A | 3D | 4A | 50/10/20/20 | 9900 |
| Polymer 71 | 1L | 2A | 3D | 4D | 50/10/20/20 | 10800 |
| Polymer 72 | 1L | 2A | 3D | 4F | 50/10/20/20 | 10900 |
| Polymer 73 | 1L | 2A | 3D | 4H | 30/10/25/35 | 8400 |
| Polymer 74 | 1L | 2A | 3D | 4H | 50/10/20/20 | 11200 |
| Polymer 75 | 1A | 2A | 3D | 4O | 50/10/20/20 | 11000 |
| Polymer 76 | 1B | 2A | 3D | 4O | 50/10/20/20 | 8500 |
| Polymer 77 | 1C | 2A | 3D | 4O | 50/10/20/20 | 11600 |
| Polymer 78 | 1E | 2A | 3D | 4O | 30/10/25/35 | 8100 |
| Polymer 79 | 1E | 2A | 3D | 4O | 50/10/20/20 | 10200 |
| Polymer 80 | 1E | 2A | 3D | 4P | 50/10/20/20 | 10300 |
| Polymer 81 | 1H | 2A | 3D | 4O | 50/10/20/20 | 10900 |
| Polymer 82 | 1I | 2A | 3D | 4M | 50/10/20/20 | 9800 |
| Polymer 83 | 1I | 2A | 3D | 4N | 50/10/20/20 | 10500 |
| Polymer 84 | 1I | 2A | 3D | 4O | 30/10/25/35 | 8500 |
| Polymer 85 | 1I | 2A | 3D | 4O | 40/20/20/20 | 10900 |
| Polymer 86 | 1I | 2A | 3D | 4O | 50/10/20/20 | 10100 |
| Polymer 87 | 1I | 2A | 3D | 4P | 50/10/20/20 | 10000 |
| Polymer 88 | 1J | 2A | 3D | 4M | 50/10/20/20 | 9500 |
| Polymer 89 | 1J | 2A | 3D | 4N | 50/10/20/20 | 10200 |
| Polymer 90 | 1J | 2A | 3D | 4O | 30/10/25/35 | 8000 |
| Polymer 91 | 1J | 2A | 3D | 4O | 50/10/20/20 | 9900 |
| Polymer 92 | 1J | 2A | 3D | 4P | 50/10/20/20 | 10100 |
| Polymer 93 | 1L | 2A | 3D | 4M | 50/10/20/20 | 9600 |
| Polymer 94 | 1L | 2A | 3D | 4N | 50/10/20/20 | 10000 |
| Polymer 95 | 1L | 2A | 3D | 4O | 30/10/25/35 | 8600 |
| Polymer 96 | 1L | 2A | 3D | 4O | 50/10/20/20 | 10500 |
| Polymer 97 | 1L | 2A | 3D | 4P | 50/10/20/20 | 10600 |
| Polymer 98 | 1I | 2B | 3A | 4D | 25/10/25/40 | 6600 |
| Polymer 99 | 1I | 2B | 3A | 4H | 25/10/25/40 | 6500 |
| Polymer 100 | 1J | 2B | 3A | 4D | 25/10/25/40 | 6700 |
| Polymer 101 | 1J | 2B | 3A | 4H | 25/10/25/40 | 6700 |
| Polymer 102 | 1L | 2B | 3A | 4D | 30/10/25/35 | 6500 |
| Polymer 103 | 1L | 2B | 3A | 4H | 30/10/25/35 | 6600 |
| Polymer 104 | 1I | 2A | 3B | 4H | 20/15/25/40 | 7000 |
| Polymer 105 | 1I | 2A | 3C | 4H | 20/15/25/40 | 7100 |
| Polymer 106 | 1I | 2A | 3E | 4H | 50/10/20/20 | 8500 |
| Polymer 107 | 1I | 2A | 3F | 4H | 50/10/20/20 | 8400 |
| Polymer 108 | 1J | 2A | 3B | 4H | 20/15/25/40 | 6500 |
| Polymer 109 | 1J | 2A | 3C | 4H | 20/15/25/40 | 6500 |
| Polymer 110 | 1J | 2A | 3E | 4H | 50/10/20/20 | 8300 |
| Polymer 111 | 1J | 2A | 3F | 4H | 50/10/20/20 | 8100 |

TABLE 3

| Polymer No. | Recurring unit (1) | Recurring unit (1) | Recurring unit (2) | Recurring unit (3) | Recurring unit (4) | Compositional ratio | Mw |
|---|---|---|---|---|---|---|---|
| Polymer 112 | 1A | 1I | 2A | 3A | 4H | 15/15/10/25/35 | 6600 |
| Polymer 113 | 1A | 1I | 2A | 3A | 4H | 20/30/10/20/20 | 6700 |
| Polymer 114 | 1A | 1J | 2A | 3A | 4D | 15/15/10/25/35 | 6500 |
| Polymer 115 | 1A | 1J | 2A | 3A | 4H | 15/15/10/25/35 | 6300 |
| Polymer 116 | 1A | 1L | 2A | 3A | 4H | 15/15/10/25/35 | 6800 |
| Polymer 117 | 1C | 1I | 2A | 3A | 4H | 15/15/10/25/35 | 7800 |
| Polymer 118 | 1C | 1I | 2A | 3A | 4H | 20/30/10/20/20 | 7600 |
| Polymer 119 | 1C | 1J | 2A | 3A | 4D | 15/15/10/25/35 | 7500 |
| Polymer 120 | 1C | 1J | 2A | 3A | 4H | 15/15/10/25/35 | 7400 |
| Polymer 121 | 1C | 1L | 2A | 3A | 4H | 15/15/10/25/35 | 7800 |
| Polymer 122 | 1E | 1I | 2A | 3A | 4H | 15/15/10/25/35 | 6100 |
| Polymer 123 | 1E | 1I | 2A | 3A | 4H | 20/30/10/20/20 | 6500 |
| Polymer 124 | 1E | 1J | 2A | 3A | 4D | 15/15/10/25/35 | 6300 |
| Polymer 125 | 1E | 1J | 2A | 3A | 4H | 15/15/10/25/35 | 6000 |
| Polymer 126 | 1E | 1L | 2A | 3A | 4H | 15/15/10/25/35 | 6200 |
| Polymer 127 | 1I | 1J | 2A | 3A | 4D | 15/15/10/25/35 | 6300 |
| Polymer 128 | 1I | 1J | 2A | 3A | 4D | 20/30/10/20/20 | 6100 |
| Polymer 129 | 1I | 1J | 2A | 3A | 4H | 15/10/10/25/40 | 6100 |
| Polymer 130 | 1I | 1J | 2A | 3A | 4H | 20/30/10/20/20 | 6200 |
| Polymer 131 | 1I | 1L | 2A | 3A | 4H | 15/15/10/25/35 | 6600 |
| Polymer 132 | 1J | 1L | 2A | 3A | 4D | 15/15/10/25/35 | 6100 |
| Polymer 133 | 1J | 1L | 2A | 3A | 4H | 15/15/10/25/35 | 6200 |
| Polymer 134 | 1A | 1I | 2A | 3D | 4H | 20/30/10/20/20 | 10500 |
| Polymer 135 | 1A | 1J | 2A | 3D | 4H | 20/30/10/20/20 | 10300 |
| Polymer 136 | 1C | 1I | 2A | 3D | 4H | 20/30/10/20/20 | 11500 |

TABLE 3-continued

| Polymer No. | Recurring unit (1) | Recurring unit (1) | Recurring unit (2) | Recurring unit (3) | Recurring unit (4) | Compositional ratio | Mw |
|---|---|---|---|---|---|---|---|
| Polymer 137 | 1C | 1J | 2A | 3D | 4H | 20/30/10/20/20 | 11200 |
| Polymer 138 | 1I | 1J | 2A | 3D | 4H | 20/30/10/20/20 | 9800 |
| Polymer 139 | 1I | 1L | 2A | 3D | 4H | 30/20/10/20/20 | 10000 |
| Polymer 140 | 1J | 1L | 2A | 3D | 4H | 30/20/10/20/20 | 10100 |
| Polymer 141 | 1A | 1I | 2A | 3D | 4O | 20/30/10/20/20 | 10800 |
| Polymer 142 | 1A | 1J | 2A | 3D | 4O | 20/30/10/20/20 | 10300 |
| Polymer 143 | 1C | 1I | 2A | 3D | 4O | 20/30/10/20/20 | 11300 |
| Polymer 144 | 1C | 1J | 2A | 3D | 4O | 20/30/10/20/20 | 11000 |
| Polymer 145 | 1I | 1J | 2A | 3D | 4O | 20/30/10/20/20 | 9700 |
| Polymer 146 | 1I | 1L | 2A | 3D | 4O | 30/20/10/20/20 | 10100 |
| Polymer 147 | 1J | 1L | 2A | 3D | 4O | 30/20/10/20/20 | 10200 |

TABLE 4

| Polymer No. | Recurring unit (1) | Recurring unit (2) | Recurring unit (3) | Recurring unit (4) | Recurring unit (4) | Compositional ratio | Mw |
|---|---|---|---|---|---|---|---|
| Polymer 148 | 1A | 2A | 3A | 4K | 4L | 30/10/25/15/20 | 6600 |
| Polymer 149 | 1B | 2A | 3A | 4K | 4L | 30/10/25/15/20 | 5400 |
| Polymer 150 | 1C | 2A | 3A | 4K | 4L | 30/10/25/15/20 | 7400 |
| Polymer 151 | 1E | 2A | 3A | 4K | 4L | 30/10/25/15/20 | 6100 |
| Polymer 152 | 1H | 2A | 3A | 4K | 4L | 25/10/25/20/20 | 7000 |
| Polymer 153 | 1I | 2A | 3A | 4A | 4H | 25/10/25/20/20 | 6800 |
| Polymer 154 | 1I | 2A | 3A | 4D | 4H | 25/10/25/20/20 | 6700 |
| Polymer 155 | 1I | 2A | 3A | 4K | 4L | 25/10/25/20/20 | 6500 |
| Polymer 156 | 1J | 2A | 3A | 4A | 4H | 25/10/25/20/20 | 6400 |
| Polymer 157 | 1J | 2A | 3A | 4D | 4H | 25/10/25/20/20 | 6300 |
| Polymer 158 | 1J | 2A | 3A | 4K | 4L | 20/15/25/20/20 | 6400 |
| Polymer 159 | 1J | 2A | 3A | 4K | 4L | 25/10/25/20/20 | 6100 |
| Polymer 160 | 1J | 2A | 3A | 4K | 4L | 50/10/20/10/10 | 6700 |
| Polymer 161 | 1L | 2A | 3A | 4A | 4H | 30/10/25/15/20 | 6900 |
| Polymer 162 | 1L | 2A | 3A | 4D | 4H | 30/10/25/15/20 | 6800 |
| Polymer 163 | 1L | 2A | 3A | 4K | 4L | 30/10/25/15/20 | 6700 |
| Polymer 164 | 1L | 2A | 3A | 4K | 4L | 50/10/20/10/10 | 6800 |

Examples

Resist compositions were formulated using inventive polymers and examined for resolution.

Examples 1-53 & Comparative Examples 1-14

Resist compositions were prepared by using inventive Polymers 1 to 164 (shown in Tables 1 to 4) or comparative Polymers 165 to 178 (synthesized by the same procedure as above or a well-known procedure and shown in Table 5 below) as the base resin, and dissolving the polymer, a photoacid generator, and a basic compound in a solvent in accordance with the recipe shown in Tables 6 to 8. These compositions were each filtered through a Teflon® filter (pore diameter 0.2 μm), thereby giving resist solutions.

TABLE 5

| Polymer No. | Recurring unit (1) | Recurring unit (2) | Recurring unit (3) | Recurring unit (4) | Compositional ratio | Mw |
|---|---|---|---|---|---|---|
| Polymer 165 | 1A | — | 3A | 4D | 40/25/35 | 6300 |
| Polymer 166 | 1A | — | 3A | 4H | 40/25/35 | 6100 |
| Polymer 167 | 1A | — | 3A | 4H | 60/20/20 | 6600 |
| Polymer 168 | 1B | — | 3A | 4D | 40/25/35 | 5200 |
| Polymer 169 | 1B | — | 3A | 4H | 40/25/35 | 5200 |
| Polymer 170 | 1B | — | 3A | 4H | 60/20/20 | 4900 |
| Polymer 171 | 1A | — | 3D | 4H | 60/20/20 | 9000 |
| Polymer 172 | 1A | — | 3D | 4O | 60/20/20 | 10800 |
| Polymer 173 | 1A | 2A | — | 4D | 40/25/35 | 6600 |
| Polymer 174 | 1A | 2A | — | 4D | 60/10/30 | 6500 |
| Polymer 175 | 1B | 2A | — | 4D | 40/25/35 | 5500 |
| Polymer 176 | 1B | 2A | — | 4D | 60/10/30 | 4900 |
| Polymer 177 | 1A | 2A | 3A | — | 40/25/35 | 6500 |
| Polymer 178 | 1B | 2A | 3A | — | 40/25/35 | 5300 |

These resist solutions were spin coated onto silicon wafers having an antireflection film (ARC29A by Nissan Chemical Co., Ltd., 78 nm thick) coated thereon, then heat treated at 130° C. for 60 seconds to form resist films having a thickness of 300 nm. The resist films were exposed using an ArF excimer laser stepper (Nikon Corporation; NA 0.68), then heat treated at 115° C., 120° C. or 130° C. for 60 seconds, and puddle developed with a solution of 2.38 wt % tetramethylammonium hydroxide in water for 60 seconds, thereby giving 1:1 line-and-space patterns.

The wafers as developed were sectioned and observed under sectional SEM. The optimal exposure (Eop, mJ/cm$^2$) was defined as the exposure dose which provided a 1:1 resolution at the top and bottom of a 0.13 μm line-and-space pattern. The resolution of the resist under evaluation was defined as the minimum line width (μm) of the lines and spaces that separated at the optimal exposure. The shape of the resist pattern was examined under a SEM and classified into rectangular or forward tapered. The adhesion of the resist film to the substrate was examined and rated as acceptable (○) or rejected (×). The degrees of line density dependency and surface roughening after development are rated as large, moderate or slight, respectively. The composition and test results of the resist of each example are reported in Tables 6 and 7. The composition and test results of the resist of each comparative example are reported in Table 8.

The photoacid generator, basic compound and solvent used are as follows. It is noted that the solvent contained 0.01% by weight of surfactant KH-20 (Asahi Glass Co., Ltd.).
TPSNf: triphenylsulfonium nonafluorobutanesulfonate
TMMEA: trismethoxymethoxyethylamine
PGMEA: propylene glycol monomethyl ether acetate

TABLE 6

| Example | Resin (pbw) | Photoacid generator (pbw) | Basic compound (pbw) | Solvent (pbw) | PEB temp., °C. | Eop, mJ/cm$^2$ | Resolution, μm | Shape | Substrate adhesion | Line density dependency | Surface roughening |
|---|---|---|---|---|---|---|---|---|---|---|---|
| 1 | Polymer 1 (80) | TPSNf (2.18) | TMMEA (0.472) | PGMEA (640) | 130 | 25 | 0.13 | rectangular | ○ | slight | large |
| 2 | Polymer 2 (80) | TPSNf (2.18) | TMMEA (0.472) | PGMEA (640) | 130 | 25 | 0.13 | rectangular | ○ | slight | slight |
| 3 | Polymer 3 (80) | TPSNf (2.18) | TMMEA (0.472) | PGMEA (640) | 130 | 18 | 0.13 | rectangular | ○ | moderate | slight |
| 4 | Polymer 4 (80) | TPSNf (2.18) | TMMEA (0.472) | PGMEA (640) | 120 | 25 | 0.13 | rectangular | ○ | slight | large |
| 5 | Polymer 5 (80) | TPSNf (2.18) | TMMEA (0.472) | PGMEA (640) | 120 | 25 | 0.13 | rectangular | ○ | slight | slight |
| 6 | Polymer 6 (80) | TPSNf (2.18) | TMMEA (0.472) | PGMEA (640) | 120 | 18 | 0.13 | rectangular | ○ | moderate | slight |
| 7 | Polymer 16 (80) | TPSNf (2.18) | TMMEA (0.472) | PGMEA (640) | 115 | 24 | 0.11 | rectangular | ○ | slight | moderate |
| 8 | Polymer 17 (80) | TPSNf (2.18) | TMMEA (0.472) | PGMEA (640) | 115 | 24 | 0.11 | rectangular | ○ | slight | slight |
| 9 | Polymer 18 (80) | TPSNf (2.18) | TMMEA (0.472) | PGMEA (640) | 115 | 16 | 0.11 | rectangular | ○ | moderate | slight |
| 10 | Polymer 20 (80) | TPSNf (2.18) | TMMEA (0.472) | PGMEA (640) | 115 | 23 | 0.11 | rectangular | ○ | slight | moderate |
| 11 | Polymer 22 (80) | TPSNf (2.18) | TMMEA (0.472) | PGMEA (640) | 115 | 23 | 0.11 | rectangular | ○ | slight | slight |
| 12 | Polymer 23 (80) | TPSNf (2.18) | TMMEA (0.472) | PGMEA (640) | 115 | 16 | 0.11 | rectangular | ○ | moderate | slight |
| 13 | Polymer 28 (80) | TPSNf (2.18) | TMMEA (0.472) | PGMEA (640) | 115 | 23 | 0.11 | rectangular | ○ | slight | moderate |
| 14 | Polyemr 29 (80) | TPSNf (2.18) | TMMEA (0.472) | PGMEA (640) | 115 | 23 | 0.11 | rectangular | ○ | slight | moderate |
| 15 | Polymer 30 (80) | TPSNf (2.18) | TMMEA (0.472) | PGMEA (640) | 115 | 16 | 0.11 | rectangular | ○ | moderate | moderate |
| 16 | Polymer 35 (80) | TPSNf (2.18) | TMMEA (0.472) | PGMEA (640) | 115 | 23 | 0.11 | rectangular | ○ | slight | slight |
| 17 | Polymer 36 (80) | TPSNf (2.18) | TMMEA (0.472) | PGMEA (640) | 115 | 23 | 0.11 | rectangular | ○ | slight | slight |
| 18 | Polymer 37 (80) | TPSNf (2.18) | TMMEA (0.472) | PGMEA (640) | 115 | 16 | 0.11 | rectangular | ○ | moderate | slight |
| 19 | Polymer 42 (80) | TPSNf (2.18) | TMMEA (0.472) | PGMEA (640) | 120 | 25 | 0.12 | rectangular | ○ | slight | slight |
| 20 | Polymer 43 (80) | TPSNf (2.18) | TMMEA (0.472) | PGMEA (640) | 120 | 18 | 0.12 | rectangular | ○ | moderate | slight |
| 21 | Polymer 45 (80) | TPSNf (2.18) | TMMEA (0.472) | PGMEA (640) | 120 | 25 | 0.12 | rectangular | ○ | slight | slight |
| 22 | Polymer 46 (80) | TPSNf (2.18) | TMMEA (0.472) | PGMEA (640) | 120 | 25 | 0.12 | rectangular | ○ | slight | slight |
| 23 | Polymer 47 (80) | TPSNf (2.18) | TMMEA (0.472) | PGMEA (640) | 120 | 18 | 0.12 | rectangular | ○ | moderate | slight |
| 24 | Polymer 52 (80) | TPSNf (2.18) | TMMEA (0.472) | PGMEA (640) | 130 | 18 | 0.13 | rectangular | ○ | moderate | slight |
| 25 | Polymer 60 (80) | TPSNf (2.18) | TMMEA (0.472) | PGMEA (640) | 115 | 16 | 0.11 | rectangular | ○ | moderate | moderate |
| 26 | Polymer 62 (80) | TPSNf (2.18) | TMMEA (0.472) | PGMEA (640) | 115 | 23 | 0.11 | rectangular | ○ | slight | slight |
| 27 | Polymer 63 (80) | TPSNf (2.18) | TMMEA (0.472) | PGMEA (640) | 115 | 16 | 0.11 | rectangular | ○ | moderate | slight |

TABLE 7

| Example | Resin (pbw) | Photoacid generator (pbw) | Basic compound (pbw) | Solvent (pbw) | PEB temp., °C. | Eop, mJ/cm² | Resolution, μm | Shape | Substrate adhesion | Line density dependency | Surface roughening |
|---|---|---|---|---|---|---|---|---|---|---|---|
| 28 | Polymer 64 (80) | TPSNf (2.18) | TMMEA (0.472) | PGMEA (640) | 115 | 16 | 0.11 | rectangular | ○ | moderate | slight |
| 29 | Polymer 66 (80) | TPSNf (2.18) | TMMEA (0.472) | PGMEA (640) | 115 | 16 | 0.11 | rectangular | ○ | moderate | moderate |
| 30 | Polymer 68 (80) | TPSNf (2.18) | TMMEA (0.472) | PGMEA (640) | 115 | 23 | 0.11 | rectangular | ○ | slight | slight |
| 31 | Polymer 69 (80) | TPSNf (2.18) | TMMEA (0.472) | PGMEA (640) | 115 | 16 | 0.11 | rectangular | ○ | moderate | slight |
| 32 | Polymer 71 (80) | TPSNf (2.18) | TMMEA (0.472) | PGMEA (640) | 120 | 18 | 0.12 | rectangular | ○ | moderate | slight |
| 33 | Polymer 73 (80) | TPSNf (2.18) | TMMEA (0.472) | PGMEA (640) | 120 | 25 | 0.12 | rectangular | ○ | slight | slight |
| 34 | Polymer 74 (80) | TPSNf (2.18) | TMMEA (0.472) | PGMEA (640) | 120 | 18 | 0.12 | rectangular | ○ | moderate | slight |
| 35 | Polymer 75 (80) | TPSNf (2.18) | TMMEA (0.472) | PGMEA (640) | 130 | 18 | 0.13 | rectangular | ○ | moderate | large |
| 36 | Polymer 84 (80) | TPSNf (2.18) | TMMEA (0.472) | PGMEA (640) | 115 | 23 | 0.11 | rectangular | ○ | slight | moderate |
| 37 | Polymer 85 (80) | TPSNf (2.18) | TMMEA (0.472) | PGMEA (640) | 115 | 16 | 0.11 | rectangular | ○ | moderate | moderate |
| 38 | Polymer 86 (80) | TPSNf (2.18) | TMMEA (0.472) | PGMEA (640) | 115 | 16 | 0.11 | rectangular | ○ | moderate | moderate |
| 39 | Polymer 87 (80) | TPSNf (2.18) | TMMEA (0.472) | PGMEA (640) | 115 | 16 | 0.11 | rectangular | ○ | moderate | slight |
| 40 | Polymer 90 (80) | TPSNf (2.18) | TMMEA (0.472) | PGMEA (640) | 115 | 23 | 0.11 | rectangular | ○ | slight | moderate |
| 41 | Polymer 91 (80) | TPSNf (2.18) | TMMEA (0.472) | PGMEA (640) | 115 | 16 | 0.11 | rectangular | ○ | moderate | moderate |
| 42 | Polymer 92 (80) | TPSNf (2.18) | TMMEA (0.472) | PGMEA (640) | 115 | 16 | 0.11 | rectangular | ○ | moderate | slight |
| 43 | Polymer 95 (80) | TPSNf (2.18) | TMMEA (0.472) | PGMEA (640) | 120 | 25 | 0.12 | rectangular | ○ | slight | slight |
| 44 | Polymer 96 (80) | TPSNf (2.18) | TMMEA (0.472) | PGMEA (640) | 120 | 18 | 0.12 | rectangular | ○ | moderate | slight |
| 45 | Polymer 97 (80) | TPSNf (2.18) | TMMEA (0.472) | PGMEA (640) | 120 | 18 | 0.12 | rectangular | ○ | moderate | slight |
| 46 | Polymer 148 (80) | TPSNf (2.18) | TMMEA (0.472) | PGMEA (640) | 130 | 25 | 0.13 | rectangular | ○ | slight | slight |
| 47 | Polymer 149 (80) | TPSNf (2.18) | TMMEA (0.472) | PGMEA (640) | 120 | 25 | 0.13 | rectangular | ○ | slight | slight |
| 48 | Polymer 155 (80) | TPSNf (2.18) | TMMEA (0.472) | PGMEA (640) | 115 | 23 | 0.11 | rectangular | ○ | slight | slight |
| 49 | Polymer 158 (80) | TPSNf (2.18) | TMMEA (0.472) | PGMEA (640) | 115 | 23 | 0.11 | rectangular | ○ | slight | slight |
| 50 | Polymer 159 (80) | TPSNf (2.18) | TMMEA (0.472) | PGMEA (640) | 115 | 23 | 0.11 | rectangular | ○ | slight | slight |
| 51 | Polymer 160 (80) | TPSNf (2.18) | TMMEA (0.472) | PGMEA (640) | 115 | 16 | 0.11 | rectangular | ○ | moderate | slight |
| 52 | Polymer 163 (80) | TPSNf (2.18) | TMMEA (0.472) | PGMEA (640) | 120 | 25 | 0.12 | rectangular | ○ | slight | slight |
| 53 | Polymer 164 (80) | TPSNf (2.18) | TMMEA (0.472) | PGMEA (640) | 120 | 18 | 0.12 | rectangular | ○ | moderate | slight |

TABLE 8

| Comparative Example | Resin (pbw) | Photoacid generator (pbw) | Basic compound (pbw) | Solvent (pbw) | PEB temp., °C. | Eop, mJ/cm² | Resolution, μm | Shape | Substrate adhesion | Line density dependency | Surface roughening |
|---|---|---|---|---|---|---|---|---|---|---|---|
| 1 | Polymer 165 (80) | TPSNf (2.18) | TMMEA (0.472) | PGMEA (640) | 130 | 25 | 0.13 | rectangular | ○ | large | large |
| 2 | Polymer 166 (80) | TPSNf (2.18) | TMMEA (0.472) | PGMEA (640) | 130 | 25 | 0.13 | rectangular | ○ | large | slight |
| 3 | Polymer 167 (80) | TPSNf (2.18) | TMMEA (0.472) | PGMEA (640) | 130 | 18 | 0.13 | rectangular | ○ | large | slight |
| 4 | Polymer 168 (80) | TPSNf (2.18) | TMMEA (0.472) | PGMEA (640) | 120 | 25 | 0.13 | rectangular | ○ | large | large |
| 5 | Polymer 169 (80) | TPSNf (2.18) | TMMEA (0.472) | PGMEA (640) | 120 | 25 | 0.13 | rectangular | ○ | large | slight |
| 6 | Polymer 170 (80) | TPSNf (2.18) | TMMEA (0.472) | PGMEA (640) | 120 | 18 | 0.13 | rectangular | ○ | large | slight |

TABLE 8-continued

| Comparative Example | Resin (pbw) | Photoacid generator (pbw) | Basic compound (pbw) | Solvent (pbw) | PEB temp., °C. | Eop, mJ/cm² | Resolution, μm | Shape | Substrate adhesion | Line density dependency | Surface roughening |
|---|---|---|---|---|---|---|---|---|---|---|---|
| 7 | Polymer 171 (80) | TPSNf (2.18) | TMMEA (0.472) | PGMEA (640) | 130 | 18 | 0.13 | rectangular | ○ | large | slight |
| 8 | Polymer 172 (80) | TPSNf (2.18) | TMMEA (0.472) | PGMEA (640) | 130 | 18 | 0.13 | rectangular | ○ | large | large |
| 9 | Polymer 173 (80) | TPSNf (2.18) | TMMEA (0.472) | PGMEA (640) | 130 | 25 | 0.13 (slimmed) | forward tapered | ○ | moderate | large |
| 10 | Polymer 174 (80) | TPSNf (2.18) | TMMEA (0.472) | PGMEA (640) | 130 | 18 | 0.13 | rectangular | ○ | large | large |
| 11 | Polymer 175 (80) | TPSNf (2.18) | TMMEA (0.472) | PGMEA (640) | 120 | 25 | 0.13 (slimmed) | forward tapered | ○ | moderate | large |
| 12 | Polymer 176 (80) | TPSNf (2.18) | TMMEA (0.472) | PGMEA (640) | 120 | 18 | 0.13 | rectangular | ○ | large | large |
| 13 | Polymer 177 (80) | TPSNf (2.18) | TMMEA (0.472) | PGMEA (640) | 130 | 25 | — (peeled) | — | X | — | — |
| 14 | Polymer 178 (80) | TPSNf (2.18) | TMMEA (0.472) | PGMEA (640) | 120 | 25 | — (peeled) | — | X | — | — |

It is seen from Tables 6, 7 and 8 that the resist compositions within the scope of the invention are improved in resolution, pattern shape, substrate adhesion and line density dependency upon ArF excimer laser exposure.

Although some preferred embodiments have been described, many modifications and variations may be made thereto in light of the above teachings. It is therefore to be understood that the invention may be practiced otherwise than as specifically described without departing from the scope of the appended claims.

Japanese Patent Application No. 2003-320659 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer comprising recurring units of the general formulae (1) to (4) and having a weight average molecular weight of 1,000 to 50,000,

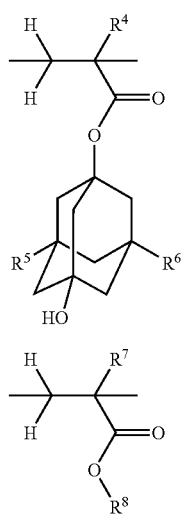

wherein $R^1$, $R^3$, $R^4$ and $R^7$ are each independently hydrogen or methyl, $R^5$ and $R^6$ are each independently hydrogen or hydroxyl, $R^8$ is a group having a lactone structure, and $R^2$ is an acid labile group selected from groups represented by the general formulae ($R^2$-7) and ($R^2$-8):

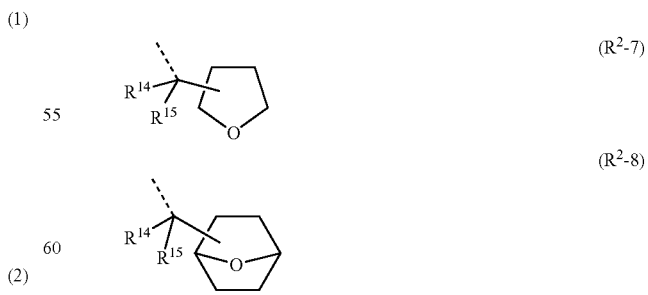

wherein a broken line depicts a bond position, and $R^{14}$ and $R^{15}$ are each independently a straight, branched or cyclic $C_1$-$C_{10}$ alkyl group, or $R^{14}$ and $R^{15}$, taken together, may form a ring with the carbon atom to which they are bonded.

2. The polymer of claim 1, wherein $R^8$ in the recurring units of formula (4) is at least one group selected from the groups represented by the general formulae ($R^8$-1) to ($R^8$-10):

($R^8$-1)
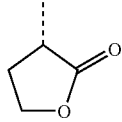

($R^8$-2)
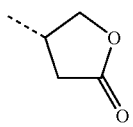

($R^8$-3)
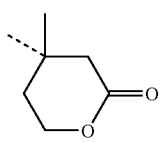

($R^8$-4)
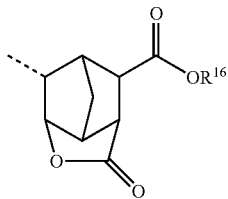

($R^8$-5)
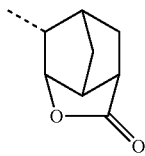

($R^8$-6)
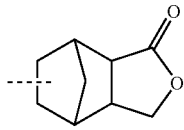

($R^8$-7)
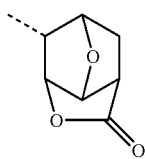

($R^8$-8)
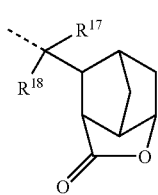

($R^8$-9)
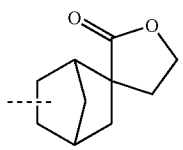

($R^8$-10)
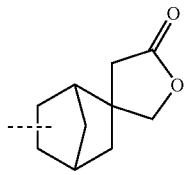

wherein a broken line depicts a bond position, $R^{16}$ is a straight, branched or cyclic $C_1$-$C_{10}$ alkyl group, and $R^{17}$ and $R^{18}$ are each independently hydrogen or a straight, branched or cyclic $C_1$-$C_{10}$ alkyl group, or $R^{17}$ and $R^{18}$, taken together, may form a ring with the carbon atom to which they are bonded.

3. A resist composition comprising the polymer of claim 1.

4. A process for forming a resist pattern comprising the steps of:
  applying the resist composition of claim 3 onto a substrate to form a coating,
  heat treating the coating and then exposing it to high-energy radiation having a wavelength of up to 300 nm or electron beams though a photomask, and
  heat treating the exposed coating and developing it with a developer.

5. A polymer comprising recurring units of the general formulae (1) to (4) and having a weight average molecular weight of 1,000 to 50,000, (1)
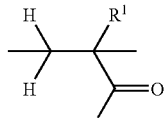

(2)
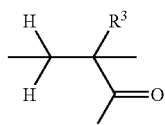

(3)
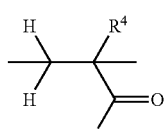

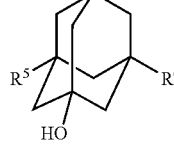

(4)
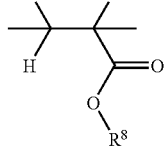

wherein $R^1$, $R^3$, $R^4$ and $R^7$ are each independently hydrogen or methyl, $R^5$ and $R^6$ are each independently hydrogen or hydroxyl, $R^8$ is a group having a lactone structure, and $R^2$ is an acid labile group which is at least one group selected from groups represented by the general formulae ($R^2$-3) to ($R^2$-6) and at least one group selected from groups represented by the general formulae ($R^2$-7) and ($R^2$-8):

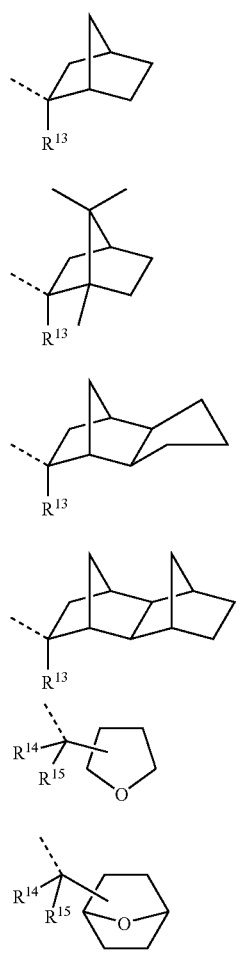

wherein a broken line depicts a bond position and bond direction, $R^{13}$ is each independently a straight, branched or cyclic $C_1$-$C_{10}$ alkyl group, and $R^{14}$ and $R^{15}$ are each independently a straight, branched or cyclic $C_1$-$C_{10}$ alkyl group, or $R^{14}$ and $R^{15}$, taken together, may form a ring with the carbon atom to which they are bonded.

6. The polymer of claim 5, wherein $R^8$ in the recurring units of formula (4) is at least one group selected from the groups represented by the general formulae ($R^8$-1) to ($R^8$-10):

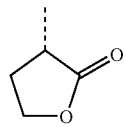

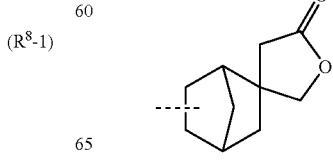

wherein a broken line depicts a bond position, $R^{16}$ is a straight, branched or cyclic $C_1$-$C_{10}$ alkyl group, and $R^{17}$ and $R^{18}$ are each independently hydrogen or a straight, branched or cyclic $C_1$-$C_{10}$ alkyl group, or $R^{17}$ and $R^{18}$, taken together, may form a ring with the carbon atom to which they are bonded.

7. A resist composition comprising the polymer of claim 5.

8. A process for forming a resist pattern comprising the steps of:
applying the resist composition of claim 7 onto a substrate to form a coating,
heat treating the coating and then exposing it to high-energy radiation having a wavelength of up to 300 nm or electron beams through a photomask, and
heat treating the exposed coating and developing it with a developer.

9. A polymer comprising recurring units of the general formulae (1) to (4) and having a weight average molecular weight of 1,000 to 50,000,

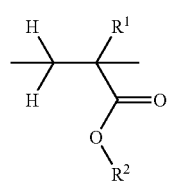

(1)

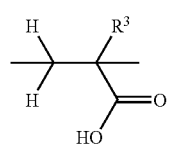

(2)

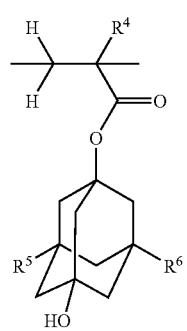

(3)

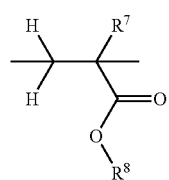

(4)

wherein $R^1$, $R^3$, $R^4$ and $R^7$ are each independently hydrogen or methyl, $R^5$ and $R^6$ are each independently hydrogen or hydroxyl, $R^8$ is a group having a lactone structure selected from the group consisting of groups represented by the general formulae ($R^8$-4) to ($R^8$-10), and $R^2$ is an acid labile group which is at least one group selected from groups represented by the general formulae ($R^2$-3) to ($R^2$-6) and at least one group selected from groups represented by the general formulae ($R^2$-7) and ($R^7$-8):

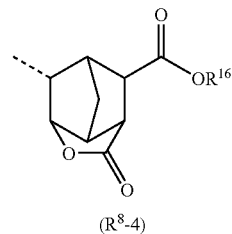

($R^8$-4)

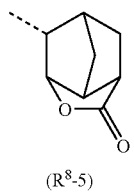

($R^8$-5)

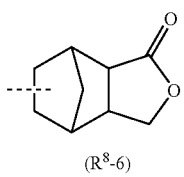

($R^8$-6)

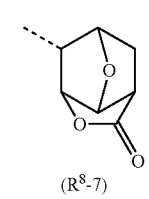

($R^8$-7)

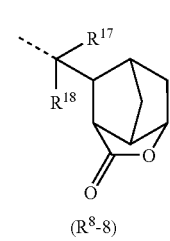

($R^8$-8)

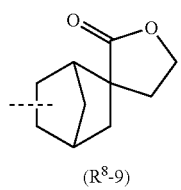

($R^8$-9)

($R^8$-10)

wherein a broken line depicts a bond position, $R^{16}$ is a straight, branched or cyclic $C_1$-$C_{10}$ alkyl group, and $R^{17}$ and $R^{18}$ are each independently hydrogen or a straight, branched or cyclic $C_1$-$C_{10}$ alkyl group, or $R^{17}$ and $R^{18}$, taken together, may form a ring with the carbon atom to which they are bonded,

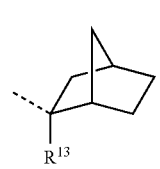

($R^2$-3)

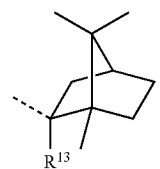

($R^2$-4)

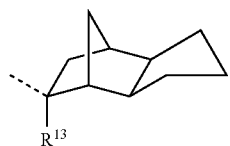 (R²-5)
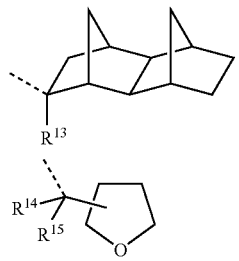 (R²-6)
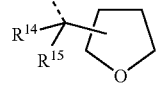 (R²-7)
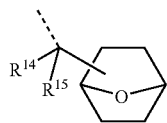 (R²-8)
wherein a broken line depicts a bond position and bond direction, $R^{13}$ is each independently a straight, branched or cyclic $C_1$-$C_{10}$ alkyl group, and $R^{14}$ and $R^{15}$ are each independently a straight, branched or cyclic $C_1$-$C_{10}$ alkyl group, or $R^{14}$ and $R^{15}$ taken together, may form a ring with the carbon atom to which they are bonded.
* * * * *